United States Patent [19]

Yoshizawa et al.

[11] Patent Number: 5,197,892

[45] Date of Patent: Mar. 30, 1993

[54] ELECTRIC CIRCUIT DEVICE HAVING AN ELECTRIC CONNECTING MEMBER AND ELECTRIC CIRCUIT COMPONENTS

[75] Inventors: Tetsuo Yoshizawa, Yokohama; Yoshimi Tarayama, Odawara; Hiroshi Kondo, Yokohama; Takashi Sakaki, Tokyo; Shunichi Haga, Yokohama; Yasuteru Ichida, Machida; Masaki Konishi, Ebina, all of Japan

[73] Assignee: Canon Kabushiki Kaisha, Tokyo, Japan

[21] Appl. No.: 677,379

[22] Filed: Mar. 27, 1991

Related U.S. Application Data

[63] Continuation of Ser. No. 359,169, May 30, 1989, abandoned.

[30] Foreign Application Priority Data

May 31, 1988 [JP]  Japan ................................. 63-133396
May 31, 1988 [JP]  Japan ................................. 63-133397

[51] Int. Cl.⁵ ........................................ H01R 9/09
[52] U.S. Cl. ........................................ 439/91; 174/52.4; 174/88 R
[58] Field of Search .................... 439/65, 66, 70, 71, 439/74, 75, 91, 586, 591; 228/180.2, 193, 194; 29/830, 840, 876, 825, 852, 884; 174/52.4, 84 R, 88 R

[56] References Cited

U.S. PATENT DOCUMENTS

| | | | |
|---|---|---|---|
| 3,320,658 | 5/1967 | Bolda et al. .......................... | 439/74 |
| 3,904,262 | 9/1975 | Cutchaw ............................. | 439/71 |
| 3,904,934 | 9/1975 | Martin ................................ | 439/74 |
| 4,000,842 | 1/1977 | Burns ................................. | 228/180.2 |
| 4,199,209 | 4/1980 | Cherian et al. ..................... | 439/591 |
| 4,332,341 | 6/1982 | Minetti .............................. | 228/193 |
| 4,505,529 | 3/1985 | Barkus .............................. | 439/82 |
| 4,667,219 | 5/1987 | Lee et al. | |
| 4,705,205 | 11/1987 | Allen et al. ........................ | 439/876 |
| 4,754,546 | 7/1988 | Lee et al. .......................... | 439/586 |
| 4,803,450 | 2/1989 | Burgess et al. .................... | 228/180.2 |
| 4,874,721 | 10/1989 | Kimura et al. .................... | 29/847 |
| 4,887,760 | 12/1989 | Yoshino et al. ................... | 228/180.2 |
| 4,927,368 | 5/1990 | Shino ................................ | 439/86 |

FOREIGN PATENT DOCUMENTS

| | | |
|---|---|---|
| 284820 | 10/1988 | European Pat. Off. . |
| 42-002096 | 1/1967 | Japan . |
| 59-139636 | 8/1984 | Japan . |
| 60-057944 | 4/1985 | Japan . |
| 2041828 | 9/1980 | United Kingdom ................. 439/91 |

OTHER PUBLICATIONS

IBM Disclosure Bulletin, Schick, vol. 7, No. 10, p. 864, Mar. 1965.
IBM Bulletin, Cameron, vol. 11, No. 8, p. 971, Jan. 1969.
IBM Technical Disclosure Bulletin, vol. 23, No. 7A, p. 2716 published Dec., 1980.

*Primary Examiner*—Neil Abrams
*Attorney, Agent, or Firm*—Fitzpatrick, Cella, Harper & Scinto

[57] ABSTRACT

An electric circuit device comprises an electric connecting member comprising a support member made of an electrically insulating material and a plurality of electrically conductive members buried in the support member and being isolated from one another. The ends of one side of the electrically conductive members are exposed at one surface of the support member, and the ends on the other side of the electrically conductive members are exposed at another surface of the support member. A first electric circuit component has connecting regions connected to the one set of ends of the electrically conductive members, and a second electric circuit component has connecting regions connected to the other set of ends of the electrically conductive members. Some of the electrically conductive members can be arranged in a zigzag pattern, and the pattern of the exposed ends of at least one electrically conductive member is wave-like or S-like.

7 Claims, 40 Drawing Sheets

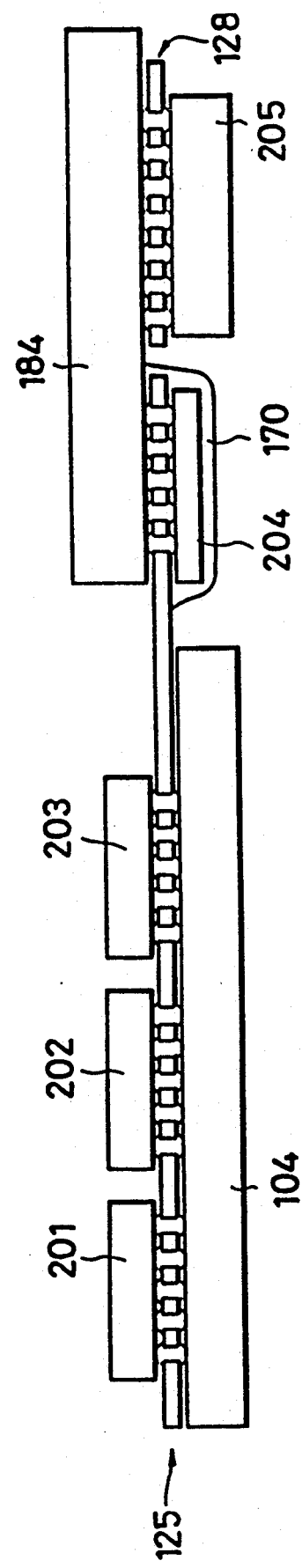

ELECTRIC CIRCUIT DEVICE HAVING AN ELECTRIC CONNECTING MEMBER AND ELECTRIC CIRCUIT COMPONENTS

This application is a continuation of application Ser. No. 359,169 filed May 30, 1989, now abandoned.

BACKGROUND OF THE INVENTION

1. Field of the Invention

This invention relates to an electric circuit device which is formed by electrically connecting electric circuit components via electric connecting members.

2. Related Background Art

Heretofore, as techniques for electrically connecting electric circuit components, there have been known, for example, 1) wire bonding method
2) TAB (Tape Automated Bonding) method (refer to, for example, Japanese Patent Public Disclosure (Kokai) No. 59-139636 (1984))
3) CCB (Controlled Collapse Bonding) method (refer to, for example, Japanese Patent Publication No. 42-2096 (1967), and Japanese Patent Public Disclosure (Kokai) No. 60-57944 (1985))
4) a method shown in FIGS. 1 and 2
5) a method shown in FIG. 3
6) a method shown in FIG. 4 and the like.

Method 4), as shown in FIGS. 1 and 2, is as follows.

That is, an insulating film 71 made of polyimide and the like is formed on portions other than a connecting region 5 of a first semiconductor device 4, a metal material 70 consisting of Au and the like is provided on the connecting region 5, and exposed surfaces 73 and 72 of the metal material 70 and insulating film 71 are then made flat. On the other hand, an insulating film 71' made of polyimide and the like is formed on portions other than a connecting region 5' of a second semiconductor device 4', a metal material 70' consisting of Au and the like is provided on the connecting region 5', and exposed surfaces 73' and 72' of the metal material 70' and insulating film 71' are then made flat.

Subsequently, the first semiconductor device 4 and the second semiconductor device 4' are then placed proximate to each other as shown in FIG. 2. After the placement, the connecting region 5 of the first semiconductor device 4 and the connecting region 5' of the second semiconductor device 4' are connected to each other via the metal materials 70 and 70' by performing thermocompression.

Method 5), as shown in FIG. 3 is as follows.

That is, an anisotropic conductive film 78 consisting of an insulating film 77 in which conductive particles 79 are dispersed is provided between a first circuit substrate 75 and a second circuit substrate 75'. After placing the first circuit substrate 75 and the second circuit substrate 75' near each other, a connecting region 76 of the first circuit substrate 75 and a connecting region 76' of the second circuit substrate 75' are connected to each other by pressurizing or pressurizing/heating.

Method 6), as shown in FIG. 4 is as follows.

That is, an elastic connector 83 consisting of an insulating material 81 in which metal wires 82 consisting of Fe, Cu and the like are disposed in a definite direction is provided between the first circuit substrate 75 and the second circuit substrate 75'. After placing the first circuit substrate 75 and the second circuit substrate 75' near each other, the connecting region 76 of the first circuit substrate 75 and the connecting region 76' of the second circuit substrate 75' are connected to each other by pressurizing.

Now, conventional bonding methods as described above have the following problems. That is, there exist restrictions in circuit design relative to bonding, a pitch size between adjacent conductors (a distance between centers of adjacent connecting regions) is large, a thinner device can not be realized, reliability is low due to corrosion or disconnection of conductors, deterioration in characteristics caused by the concentration of thermal stress between a bonding member and an electric circuit component and the like, it is difficult to replace only an electric circuit component when the electric circuit component fails, and the like.

In the technique shown in FIGS. 1 and 2, there are the following problems:

a) The exposed surface 72 of the insulating film 71 and the exposed surface 73 of the metal material 70, or the exposed surface 72' of the insulating film 71' and the exposed surface 73' of the metal material 70' must be made flat. Hence, production process for that purpose is increased, and production cost becomes high.

b) If there exists an unevenness between the exposed surface 72 of the insulating film 71 and the exposed surface 73 of the metal material 70, or between the exposed surface 72' of the insulating film 71' and the exposed surface 73' of the metal material 70', the metal material 70 and the metal material 70' become disconnected to each other, and so reliability is decreased.

Furthermore, in the technique shown in FIG. 3, there are the following problems:

a) When connecting the connecting region 76 and the connecting region 76' by pressurizing after placing them near each other, it is difficult to apply a uniform pressure. Hence, there occur variations in connecting state, and as a result, variations in contact resistance value at the connecting regions become large. This fact causes a decrease in reliability of connection. In addition, since phenomena such as heating and the like occur when a large amount of current is passed, this method is unsuitable when it is intended to pass a large amount of current.

b) Even if a uniform pressure can be applied, variations in resistance value become large according to an arrangement of the conductive particles 79 in the anisotropic conductive film 78. Reliability in connection is thereby decreased. Furthermore, this method is unsuitable when it is intended to pass a large amount of current.

c) When a pitch between adjacent connecting regions (a distance between centers of adjacent connecting regions) is reduced, a resistance value between adjacent connecting regions becomes small. Hence, this method is unsuitable for a high-density connection.

d) Since resistance values change due to variations in the amount $h_1$ of protrusion of the connecting regions 76 and 76' of the circuit substrates 75 and 75', it is necessary to exactly control the amount of variations of the $h_1$.

e) When the anisotropic conductive film is used for the connection between a semiconductor device and a circuit substrate, and the connection between a first semiconductor device and a second semiconductor device, there exists the disadvantage that bumps must be provided on connecting regions of the semiconductor devices and so production cost becomes high.

Furthermore, when the technique shown in FIG. 4 is used for the connection between a semiconductor device and a circuit substrate, or the connection between a first semiconductor device and a second semiconductor device, there are the following problems:

a) It is necessary to apply a pressure, and so it is necessary to provide a pressurizing jig.

b) Since contact resistance between the metal wires 82 of the elastic connector 83 and the connecting region 76 of the first circuit substrate 75 or the connecting region 76' of the second circuit substrate 75' changes according to a pressurizing force and surface state, reliability in connection is small.

c) Since the metal wires 82 of the elastic connector 83 are rigid, the surfaces of the elastic connector 83, the first circuit substrate 75 and the second circuit substrate 75' have a large possibility of being damaged when a pressurizing force is large. On the contrary, reliability in connection becomes small when a pressurizing force is small.

d) Since the amount $h_2$ of protrusion of the connecting regions 76 and 76' of the circuit substrates 75 and 75', the amount $h_3$ of protrusion of the metal wires 82 of the elastic connector 83 and variations thereof influence variations in resistance value and damage, a contrivance for decreasing the variations is required.

SUMMARY OF THE INVENTION

It is an object of the present invention to solve all the problems as described above.

It is a further object of the present invention to provide a novel electric circuit device which has a high density and a high reliability and is low in cost.

It is a still further object of the present invention to provide an electric circuit device which can replace conventional connection methods and sealing methods, and in which a high-density multipoint connection can be obtained and various properties such as thermal property and the like can be improved.

It is still another object of the present invention to provide an electric circuit device comprising an electric connecting member comprising a support member made of an electrically insulating material and a plurality of electrically conductive members buried in the support member and being isolated from one another. One end of the electrically conductive members are exposed at one surface of the support member, and the other end of the electrically conductive members are exposed at another surface of the support member. An electric circuit component "a" has connecting regions connected to one end of the electrically conductive members, and another electric circuit component "b" has connecting regions connected to the other end of the electrically conductive members. In addition, at least some of the exposed electrically conductive members are arranged in a zigzag pattern.

It is still a further object of the present invention to provide an electric circuit device comprising an electric connecting member comprising a support member made of an electrically insulating material and a plurality of electrically conductive members buried in the support member and being isolated from one another. One end of the electrically conductive members are exposed at one surface of the support member, and the other end of the electrically conductive members are exposed at the other surface of the support member. An electric circuit component "a" has connecting regions connected to one end of the electrically conductive members, and another electric circuit component "b" has connecting regions connected to another end of the electrically conductive members. The pattern of the exposed ends of at least one of the electrically conductive member is wave-like or S-like.

BRIEF DESCRIPTION OF THE DRAWINGS

FIGS. 5(a) and 5(c), FIGS. 5(b) and 5(d) and FIGS. 5(c)-1 through 5(c)-6 are cross-sectional views showing Examples 1-D1 through Examples 1-E2; FIG. 5(a), FIG. 5(b) and FIGS. 5(c)-1 through FIGS. 5(C)-6 show states before connection, after connection and after sealing, respectively;

FIG. 6 consists of diagrams for explaining an example of the production method of an electric connecting member used in Example 1-D1 through Example 1-E2.

FIG. 7(a) and FIGS. 7(b)-1 through 7(b)-6 show Example 2-D1 through Example 2-E2; FIG. 7(a) is a perspective view, FIGS. 7(b)-1 through 7(b)-6 are cross-sectional views;

FIGS. 8(a)-1 through 8(a)-6 are cross-sectional views showing Example 3-D1 through Example 3-E2, and FIGS. 8(b)-1 through 8(b)-5 are cross-sectional views showing modified examples of Example 3-D1 through Example 3-E1;

FIGS. 9(a)-1 through 9(a)-6 are cross-sectional views showing Example 4-D1 through Example 4-E2, and FIGS. 9(b)-1 through 9(b)-4 are cross-sectional views showing modified examples of Example 4-D1 through Example 4-D4;

FIG. 10 shows Example 5.

FIGS. 11 and 12 also show Example 5.

FIG. 13(a) and FIGS. 13(b)-1 through 13(b)-6 show Example 6-D1 through Example 6-E2; FIG. 13(a) is a perspective view showing a state before connection, and FIGS. 13(b)-1 through 13(b)-6 are cross-sectional views showing states after connection;

FIG. 14 consists of cross-sectional views showing Example 7.

FIG. 15 shows an electric connecting member according to Example 8.

FIG. 16 shows a production example of an electric connecting member according to Example 9.

FIG. 17 consists of diagrams showing Example 10.

FIG. 18 shows Example 11.

FIG. 21 shows Example 13.

FIG. 22 shows Example 14; FIG. 23 is a cross-sectional view showing Example 15.

Figure 1:
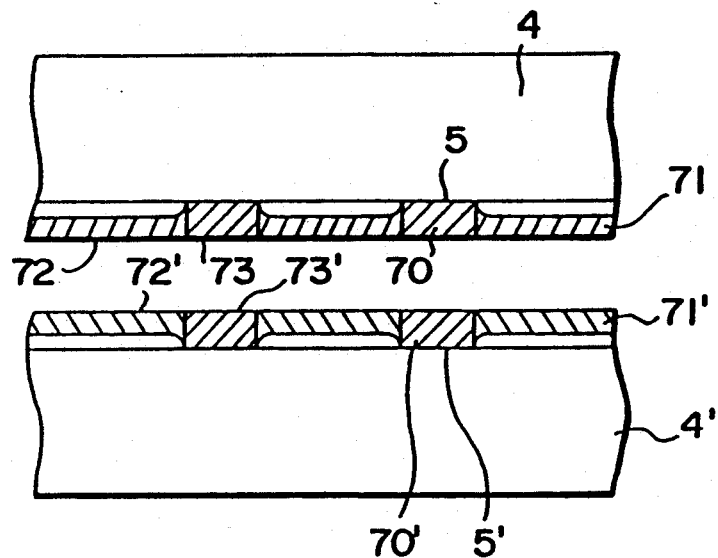
FIGS. 1 through 4 are cross-sectional views showing conventional examples.

It is to be noted that an explanation about embodiments of the present application other than those described above will also be provided according to the above-described drawings.

DETAILED DESCRIPTION OF THE PREFERRED EMBODIMENTS

First, main compositional prerequisites of the present invention will be hereinafter individually explained.

Electric Circuit Components

As electric circuit components in the present invention, there are, for example, circuit substrates, such as resin circuit substrates, ceramic substrates, metal substrates, silicon substrates and the like (occasionally, simply termed hereinafter "circuit substrate"), semiconductor devices, lead frames and the like.

Electric circuit components connected to an electric connecting member may exist individually or in a plurality on one surface of a support member.

Components having connecting regions as electric circuit components are objects of the present invention. Although the number of connecting regions is arbitrary, advantages of the present invention increase as the number of connecting regions is larger.

Although the existence positions of connecting regions are also arbitrary, effects of the present invention become more remarkable as they exist more toward the inner portion of an electric circuit component.

At least two electric circuit components, the connecting regions of which exist at end portions of the electric circuit components, may be connected on one surface and another surface of an electric connecting member, or may be connected on an identical surface thereof.

It is to be noted that a connecting region is made of an electrically conductive material.

Electric Connecting Members

An electric connecting member according to the present invention has a configuration that a plurality of electrically conductive members are buried in a support member consisting of an electrically insulating material. The buried conductive members are electrically insulated from one another.

One end of the electrically conductive members are exposed at one surface of the support member, and the other end is exposed at another surface of the support member.

Furthermore, an electric connecting member may consist of one layer or a multilayer consisting of not less than two layers.

Electrically Conductive Members

Any material can be used as electrically conductive members provided that it is electrically conductive. Metal materials are commonly used.

As a material for a metal member, gold is preferable, but any metals other than gold or alloys may also be used. Such metals and alloys are, for example, Ag, Be, Ca, Mg, Mo, Ni, W, Fe, Ti, In, Ta, Zn, Cu, Al, Sn, Pb-Sn.

Relative to metal members and alloy members, an identical kind of metal or different kinds of metals may exist within an identical electric connecting member.

Furthermore, metal members or alloy members of an electric connecting member may consist of an identical metal or an alloy, or different metals or alloys. Other than metals or alloys, a material in which one or both of an organic material and an inorganic material are contained in a metal material may also be used, provided that it is conductive. A combination of an inorganic material and an organic material may also be used, provided that it is conductive.

Arrangement and Shape of an Electric Connecting Member

This invention has a feature that ends of electrically conductive members exposed from a support member of an electric connecting member are arranged in a zigzag form, or pattern.

Plural zigzag rows may also be formed provided that there exists a zigzag form. The zigzag form may be regular or irregular. Only the exposed portion may be arranged in a zigzag form, and a portion within a support member may not be arranged in a zigzag form. A zigzag form may be arranged on either one surface of a support member, and the exposed portion may not be arranged in a zigzag form on both surfaces of a support member. Furthermore, a zigzag form is not necessarily arranged on the entire surface of a support member, but a zigzag form may be partially (locally) arranged.

The present invention has also a feature that the form of the ends of the electrically conductive members exposed from a support member of an electric connecting member is wave-like or s-like. Also in this case, a portion within a support member may have any form. Ends of exposed electrically conductive members may partially have a wave-like form or an s-like form. The form of connecting regions of an electric circuit component may be wave-like, s-like, or other shapes.

The size of an electrically conductive member is not specifically limited. Considering the pitch of connecting regions of an electric circuit component, the diameter is preferably, for example, no smaller than 20 $\mu m\phi$, but it may also be no larger than 20 $\mu m\phi$.

Exposed portions of electrically conductive members may be on a surface identical to that of a support member, or may protrude from the surface of the support member. The protrusion may be on one surface or on both surfaces. When protruded, protruded portions may have the form of a bump.

A spacing between electrically conductive members may be identical to a spacing between connecting regions of an electric circuit component, or may be narrower than that spacing. In the case of a narrower spacing, it becomes possible to connect an electric circuit component to an electric connecting member without locating the electric circuit component relative to the electric connecting member.

Electrically conductive members are not required to be perpendicularly disposed within a support member, but they may be obliquely disposed from one surface toward another surface of the support member.

Support Member

A support member is made of an electrically insulating material.

Any material may be used provided that it is an electrically insulating material. As electrically insulating materials, there are organic materials and inorganic materials. Metals or alloy materials subjected to processing so that electrically conducting members are electrically insulated from one other may also be used. Furthermore, one kind or plural kinds of inorganic materials, metal materials and alloy materials which have a desired shape, such as a powder, fibers, plate-like bodies, rod-like bodies, spherical bodies and the like, may also be dispersed and contained within an organic material. Furthermore, one kind or plural kinds of organic materials, metal materials and alloy materials which have a desired shape, such as a powder, fibers, plate-like bodies, rod-like bodies, spherical bodies and the like, may also be dispersed and contained within an inorganic material. Otherwise, one kind or plural kinds of inorganic materials and organic materials which have a desired shape, such as a powder, fibers, plate-like bodies, rod-like bodies, spherical bodies and the like, may also be dispersed and contained within a metal material. When a support member consists of a metal material, an electrically insulating material, such as a resin and the like, may, for example, be disposed between electrically conductive members and a support member.

As an organic material, an insulating resin may, for example, be used. As a resin, either of a thermosetting resin, a UV-curable resin and a thermoplastic resin may be used. It is possible to use polyimide resins, polyphenylene sulfide resins, polyether sulfone resins, polyether imide resins, polysulfone resins, fluororesins, polycarbonate resins, polydiphenyl ether resins, polybenzyl imidazole resins, polyamideimide resins, polypropylene resins, polyvinyl chloride resins, polystyrene resins, metyl metacrylate resins, polyphenylene oxide resins, phenol resins, melanin resins, epoxy resins, urea resins, metacrylate resins, vilylidene chloride resins, alkyd resins, silicone resins, and other resins.

It is preferable to use a resin which has an excellent heat-conductive property among these resins because, even when a semiconductor device has heat, the heat can be radiated through the resin. Furthermore, if a resin which has a coefficient of thermal expansion identical or similar to that of the circuit substrate is selected, and at least one hole or a plurality of air bubbles are provided within the organic material, it is possible to further prevent a decrease in reliability of a device according to thermal expansion/thermal contraction.

As concrete metal materials or alloy materials, there are, for example, metals or alloys, such as Ag, Cu, Au, Al, Be, Ca, Mg, Mo, Fe, Ni, Si, Co, Mn, W, Cr, Nb, Zr, Ti, Ta, Zn, Sn, Pb-Sn and the like.

As inorganic materials, there are, for example, ceramics, such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, BaO, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$ and the like, and other inorganic materials, such as diamond, glasses, carbon, boron and the like.

Connection

For a connection between an end of an electric connecting member and an electric circuit component, the following three configurations may be considered.

1) A configuration in which all electric circuit components are connected by metallizing and/or alloying connecting regions thereof and one end of a plurality of electrically conductive members are exposed on one surface of a support member.

2) A configuration in which at least one electric circuit component is connected by metallizing and/or alloying connecting regions thereof and one end of a plurality of electrically conductive members are exposed at one surface of a support member, and other electric circuit components are connected by a method other than metallization and/or alloying.

3) A configuration in which all electric circuit components are connected by a method other than metallization and/or alloying at connecting regions thereof and one end of a plurality of electrically conductive members are exposed on one surface of a support member.

Connection by Metallization and/or Alloying

Now, a connection by metallization and/or alloying will be described.

When electrically conductive members and connecting regions to be connected to one another are made of an identical pure metal, layers formed by metallization have a crystal structure identical to that of the electrically conductive members or the connecting regions. Relative to a method of metallization, after contacting, for example, ends of electrically conductive members with connecting regions corresponding to the ends, they may be heated at an appropriate temperature. In this case, diffusion and the like of atoms occur near the contacting portions by heating, and the diffused portions enter a metallic state to form metallic layers.

When electrically conductive members and connecting regions to be connected to one another are made of different pure metals, connecting layers which are formed are made of an alloy of the two metals. Relative to a method of alloying, after contacting, for example, ends of electrically conductive members with connecting regions corresponding to the ends, they may be heated at an appropriate temperature. In this case, diffusion and the like of atoms occur near the contacting portions by heating, and layers consisting of a solid solution or an intermetallic compound are formed near the contacting portions.

When Au is used as a metal material for an electric connecting member, and Al is used for connecting regions of an electric circuit component, a heating temperature of 200°-350° C. is preferred.

When one of the electrically conductive members and connecting regions to be connected to one another is made of a pure metal and the other is made of an alloy, or when both are made of an identical kind of alloy or different kinds of alloys, the connected interface consists of an alloy layer.

Relative to a plurality of electrically conductive members within one electric connecting member, there are cases such that each electrically conductive member consists of an identical metal or alloy, each consists of a different metal or alloy and other cases. Furthermore, relative to one electrically conductive member, there are cases such that it consists of an identical metal or alloy, it consists of different metals or alloys and other cases. In any case, however, the above-described metallization or alloy formation is performed. The situation is the same for connecting regions.

Electrically conductive members or connecting regions may be made of a metal or an alloy at connecting portions of the two. Other portions may be, for example, under the state in which an inorganic material, such as glass and the like, is compounded with a metal or under the state in which an organic material, such as a resin and the like, is compounded with a metal.

A plated layer consisting of a metal which can easily form an alloy or an alloy may also be provided on the surface of portions to be connected to each other.

As a heating method, internal heating methods, such as an ultrasonic heating method, a high-frequency induction heating method, a high-frequency dielectric heating method, a micro-wave heating method and the like, or other external heating methods may also be used other than a thermocompression method and the like, or the above-described methods may be used together. In either heating method, connection is performed by directly or indirectly heating connecting portions.

Connection by Methods Other Than Metallization and/or Alloy Formation

In order to perform connection by a method other than the above-described metallization or alloy formation, connection may, for example, be performed by pressing an electric circuit component and electric conductive members of an electric connecting member.

As other connection methods, there is a connection method using a connecting adhesive and the like.

That is, there is a method in which connection is performed by sticking together an electric circuit component and electrically conductive members at at least some part except the connecting portions thereof.

Removable Connection

Among the above-described connection methods, a method which can perform a removable connection (for example, a connection by pressing) may be selected for electric circuit components which need to be replaced.

When performing connection by metallization and/or alloy formation as well, it may be arranged so that the melting point of the metal layer or alloy layer for electric circuit components to be removed is lower that the melting point of the metal layer or alloy layer for electric circuit components not to be removed. That is, in such a configuration, by heating at a temperature which is higher than the melting point of the metal layer or alloy layer for electric circuit components to be removed and lower than the melting point of the metal layer or alloy layer for electric circuit components not to be removed, only electric circuit components to be removed can be removed without giving bad influences, such as damage and the like, over connecting regions of electric circuit components not to be removed. In the present invention, the removable connection also includes such a connection.

Applications

As electric circuit components in the present invention, there are, for example, recording heads, such as thermal print heads, ink jet heads and the like, functional heads, such as liquid crystal panels and the like, devices for driving electric circuit devices (for example, driver devices in which driver semiconductor devices exist in proximity), devices for driving long devices having many functional elements, devices for amplifying long devices having many sensors, and the like.

Sealants

In the present invention, when there exist electric circuit components not to be removed, sealing may be performed by burying the electric circuit components in a sealant.

Sealing may be performed only for one electric circuit component or for a plurality of electric circuit components.

Materials for Sealants

In the present invention, as a material for a sealant, it is possible to use a thermoplastic resin. As thermoplastic resins, it is possible to use, for example, polyimide resins, polyphenylene sulfide resins, polyether sulfone resins, polyether imide resins, polysulfone resins, fluororesins, polycarbonate resins, polydiphenyl ether resins, polybenzyl imidazole resins, polyamideemide resins, polypropylene resins, polyvinyl chloride resins, polystyrene resins, metyl metacrylate resins, and other resins.

The sealant may be one of the above-described resins, or may be one of the above-described thermoplastic resins in which one kind or plural kinds of metals, alloys or inorganic materials having an arbitrary shape, such as a powder, fibers, plate-like bodies, rod-like bodies, spherical bodies and the like, are dispersed. Dispersion may be performed by adding a material or materials having a shape of a powder, fibers, plate-like bodies, rod-like bodies, spherical bodies and the like, in a resin and mixing the resin. Dispersion may, of course, be performed not by such a method, but a material or materials having the shape of powder, fiber, plate-like, rod-like, spherical and the like, may also be dispersed in a resin by other arbitrary methods.

As the above-described metals or alloys, there are, for example, metals or alloys of Ag, Cu, Au, Al, Be, Ca, Mg, Mo, Fe, Ni, Si, Co, Mn, W and the like.

As inorganic materials, there are, for example, ceramics, such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, BaO, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$ and the like, and other inorganic materials, such as diamond, glasses, carbon, boron and the like.

The size and shape of a material or materials to be dispersed having the shape of a powder, fibers, plate-like bodies, rod-like bodies, spherical bodies and the like, and dispersed positions and amounts thereof in an insulator are arbitrary.

A material or materials having the shape of a powder, fibers, plate-like bodies, rod-like bodies, spherical bodies and the like may or may not contact one another.

Sealing Methods

As a method for sealing by a sealant, electric circuit members (members comprising an electric connecting member and electric circuit components connected thereto) may be housed within a cavity of a mold, and a sealant may be injected into the cavity by injection molding. Electric circuit members may be sealed by such injection molding, or by extrustion, core molding, cavity molding or any other methods.

Furthermore, the above-described sealant and a plate (the plate consists of a material different from the sealant) may also be used together. As such sealing states, there is a case in which a plate is connected to at least a part of the surface of a sealant, a case in which electric circuit components and at least a part of the plate connected to at least a part of at least one of the other electric circuit components connected to an electric connecting member at a surface opposite to the electric connecting member is buried by a sealant, and a case in which electric circuit components and at least a part of a plate disposed near sides of either one or a plurality of electric circuit components connected to an electric connecting member are buried by the sealant.

Plate

The material of the plate is arbitrarily provided so that it is different from the material of the sealant.

The thickness of the plate is, for example, preferably 0.05–0.5 mm in the case of a stainless plate.

When connecting the plate, the method of connection is not specifically limited. The plate may, for example, be connected using an adhesive and the like, or other methods may also be used.

Cap

In the present invention, electric circuit components may be subjected to cap sealing.

The cap sealing is a method for wrapping electric circuit components and sealing them so that a cavity exists inside.

A cap may be provided only for one electric circuit component, or caps may be provided for a plurality of electric circuit components.

When performing cap sealing, it is peferred to perform sealing so that electric circuit components are firmly held to an electric connecting member. For example, the inner surface of a cap may have the form corresponding to the shape of the external surface of an electric circuit component, and cap sealing may be performed so that the inner surface of the cap contacts the external surface of the electric circuit component.

A cap may be connected to an electric circuit component or another cap (when an electric circuit component existing on one surface of a support member and an electric circuit component existing on another surface the support member are subjected to cap sealing) by using an adhesive, a mechanical method, a method by welding and other arbitrary methods.

Materials for Cap Sealing

A material for a cap may be an organic material, an inorganic material, a metal material or a composite material of these materials.

As a sealing state, one electric circuit component or a plurality of electric circuit components may be sealed by an identical cap. Sealing may be performed so that a cap presses an electric circuit component or a cap holds an electric circuit component.

Furthermore, sealing may be performed by providing a member between an electric circuit component and a cap. In this case, a more remarkable effect can be obtained if a plurality of electric circuit components are sealed by an identical cap.

Connection between a cap and an electric circuit component and the like may be performed by any method.

Members for adjustment

In the present invention, a member for adjustment may be provided between a cap and an electric circuit component.

As a material for a member for adjustment, although either a metal material, an inorganic material as an organic material may be used, an elastic material is preferred.

A material having any shape may be used provided that it is possible to adjust the size of an electric circuit component in the direction of its height.

In the present invention, since an electric circuit component is connected to other electric circuit components using the above-described electric connecting member, it becomes possible to dispose connecting regions of an electric circuit component at inner portions (portions other than external peripheral portions) in high density as well as at external peripheral portions, to increase the number of connecting regions, and, as a result, to provide a high-density device.

It is also possible to make an electric connecting member thin, and hence it also becomes possible to provide a thin electric circuit member from this fact.

Furthermore, since the amount of metal material used for an electric connecting member is small, it becomes possible to reduce cost—even if gold, which is an expensive material, is used as a metal material.

In the present invention, since electrically conductive members exposed from a support member of an electric connecting member are arranged in a zigzag form, and an area occupied by connecting regions is larger than that of an interconnection pattern in an electric circuit component, a connection with higher density can be achieved.

Furthermore, since an electric connecting member can have a pitch which is apparently larger than a substantial pitch, its production becomes easier, and this fact is useful in reducing cost. Moreover, breakdown voltage between adjacent conductive members increases and electric properties, such as leakage current and the like, are improved. Hence, it is possible to provide an electric circuit device which has excellent reliability.

In the present invention, since electrically conductive members exposed from a support member of an electric connecting member have a wave-like or S-like form, connection can be firmly maintained even if, for example, any force is applied to connecting regions from any directions. Accordingly, it is possible to provide an electric circuit device which has excellent mechanical and structural properties and reliability. Such properties are more remarkably realized when connection is performed by a method other than metallization and/or alloy formation.

In the present invention, if electric circuit components are connected together by metallization and/or alloy formation via an electric connecting member, the electric circuit components are firmly (strongly in strengh) and securely connected together. Hence, it is possible to provide an electric circuit device which has a low connection resistance and small variations, and which is also mechanically strong and has an extremely low failure rate.

Furthermore, when electric circuit components are connected together by metallization and/or alloy formation via an electric connecting member, it is not necessary to hold electric circuit components using jigs and the like during the production process, and after production of an electric circuit device, and production of an electric circuit device and its administration after production are easy.

When all electric circuit components are connected by metallization and/or alloy formation via an electric connecting member, the contact resistance between electric circuit components become smaller compared with a case when only one electric circuit component is connected.

On the other hand, when all electric circuit components are connected together by a method other than metallization and/or alloy formation, it is possible to prevent deterioration of electric circuit components due to heat which is produced during metallization and/or alloy formation.

When electric circuit components are removably connected together, it becomes possible to replace failed components by other electric circuit components even if various kinds of failures occur, and to reduce costs, such as production cost and the like.

When electric circuit components having a tendency of producing a failure and the like have previously been known, if the melting point of the metal layer or alloy layer formed by metallization and/or alloy formation in the electric circuit components is made lower than the melting point in other electric circuit components, electric circuit components are firmly (strongly in strength) and securely connected together while using an electric circuit device. Hence, it is possible to provide an electric circuit device which has a low connection resistance and variances and is also mechanically strong, and it is also possible to replace only electric circuit components in which a failure and the like occur when once a failure and the like occur, and to reduce costs, such as a production cost and the like.

In the present invention, when sealing is performed using a sealant, since an electric connecting member is configured such that electrically conductive members are buried within a support member, the electric connecting member is less influenced by sealing pressure, sealing speed and the like when a sealant is injected, and hence it is possible to use any sealing method. That is, even a sealing using a sealant for which an extremely high-pressure injection is required, such as a thermoplastic resin, becomes also possible.

Furthermore, in the present invention, when a plate is connected to at least a part of the surface of a sealant, when electric circuit components and at least a part of a plate connected to at least a part of at least one electric circuit component connected to an electric connecting member at a surface opposite to the electric connecting member are buried by a sealant, or when electric circuit components and at least a part of a plate disposed at near sides of either one of or a plurality of electric circuit components connected to an electric connecting member are buried by a sealant, it is possible to release stress concentration even if an internal stress is produced within the device or a force is applied from the outside. It is also possible to prevent cracks and the like which may sometimes be produced due to stress concentration. The plate also has an effect for lengthening a path from the outside up to electric circuit components, and hence water and the like from the outside hardly penetrate into electric circuit components. Hence, it is possible to improve reliability of the device.

When the material of the plate is a metal, such as stainless steel and the like, or ceramics, carbon, diamond and the like which have excellent heat conductive properties, the heat generated from electric circuit components can be promptly radiated to the outside. Hence, it is possible to provide an electric circuit device which is excellent in radiating heat. Furthermore, when the material of the plate is a metal, it is possible to interrupt a noise from the outside, and it is possible to provide an electric circuit device having excellent properties which is less influenced by a noise, can interrupt electromagnetic noises generated in electric circuit components and generates less noise.

In the present invention, when cap sealing is performed, since an electric circuit device is hollow, less thermal stress is generated, and it is possible to provide an electric circuit device which has a high reliability. Furthermore, when a cap is contacted to an electric circuit component, and a material having a high heat-conductive property is used for the cap, the heat generated from the electric circuit component is rapidly conducted to the outside via the cap and it is possible to provide an electric circuit device having an excellent heat-radiating property. In addition, when the cap is made of a material having an excellent noise-shielding property, particularly a metal such as an iron-system metal and the like, it is possible to provide an electric circuit device having an excellent shielding effect. Moreover, when a member for adjustment is provided between the cap and the electric circuit component, it becomes possible to effectively perform assembly even when variations in the height of electric circuit components occur.

In the present invention, when a material having an excellent heat-conductive property is used as an insulator for electrically conductive members, and a material having the shape of a powder, fibers, plate-like bodies, rod-like bodies, spherical bodies and the like which has a high heat-conductive property is dispersed in a sealant, the heat generated from electric circuit components is radiated more quickly to the outside, and it is possible to provide an electric circuit device having a high heat-radiating property. Furthermore, when an insulator for electrically conductive members with a coefficient of thermal expansion close to that of the electric circuit components is used, and a material or materials having the shape of a powder, fibers, plate-like bodies, rod-like bodies, spherical bodies and the like with a coefficient of thermal expansion close to that of electric circuit components are dispersed in a sealant, the coefficient of thermal expansion of the sealant becomes close to that of the electric circuit components, and it is possible to prevent phenomena destroying reliability of an electric circuit device, such as cracks of the sealant and electric circuit components which may sometimes occur when heat is applied, or a change in characteristics of the electric circuit components. Hence, it is possible to provide an electric circuit device which has a high reliability.

Furthermore, by selecting a material having a high shielding effect for an insulator, it is possible to reduce electromagnetic noises generated from electric circuit components to the outside, and also reduce a noise which enters from the outside into electric circuit components.

EXAMPLE 1-D1

The Example 1-D1 of the present invention will be explained according to FIGS. 5(a), 5(b), 5(c)-1 and 6.

An electric circuit device of the present embodiment at least comprises an electric connecting member 125 comprising a support member 111 consisting of an organic material and metal members 107 which are plural electrically conductive members buried within the support member 111, one ends of the metal members 107 being exposed at one surface of the support member 111, and another ends of the metal members 107 being exposed at another surface of the support member 111;

a circuit substrate 104 comprising connecting regions 105 and connected to one ends of the metal members 107 exposed at one surface of the support member 111 at the connecting regions 105;

a circuit substrate 184 comprising connecting regions 194 and connected to another ends of the metal members 107 exposed at another surface of the support member 111 at the connecting regions 194. The metal members 107 exposed at both surfaces of the support member 111 are arranged in a zigzag form, and the metal members 107 have a wave-like form.

The present embodiment will be hereinafter explained in detail.

First, the electric connecting member 125 will be explained illustrating a production method of the electric connecting member 125.

Figure 5A:
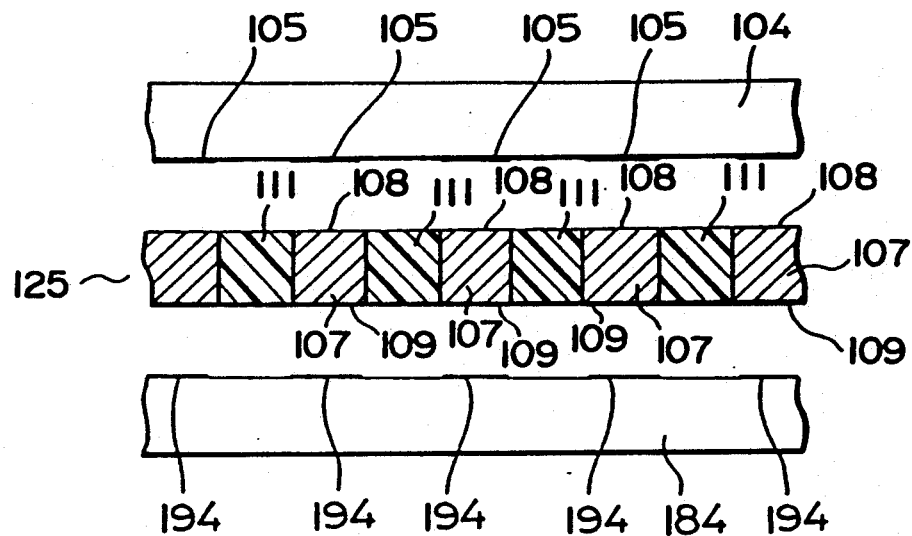
Figure 5B:
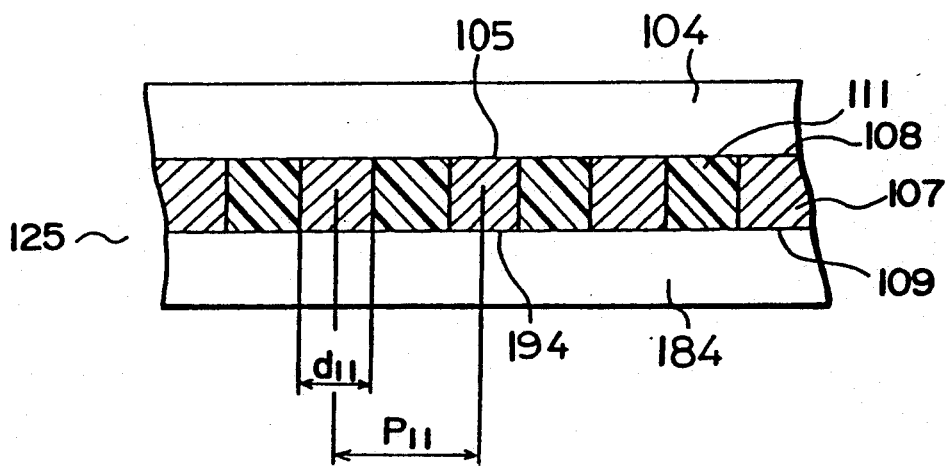
Figures 1, 5C:
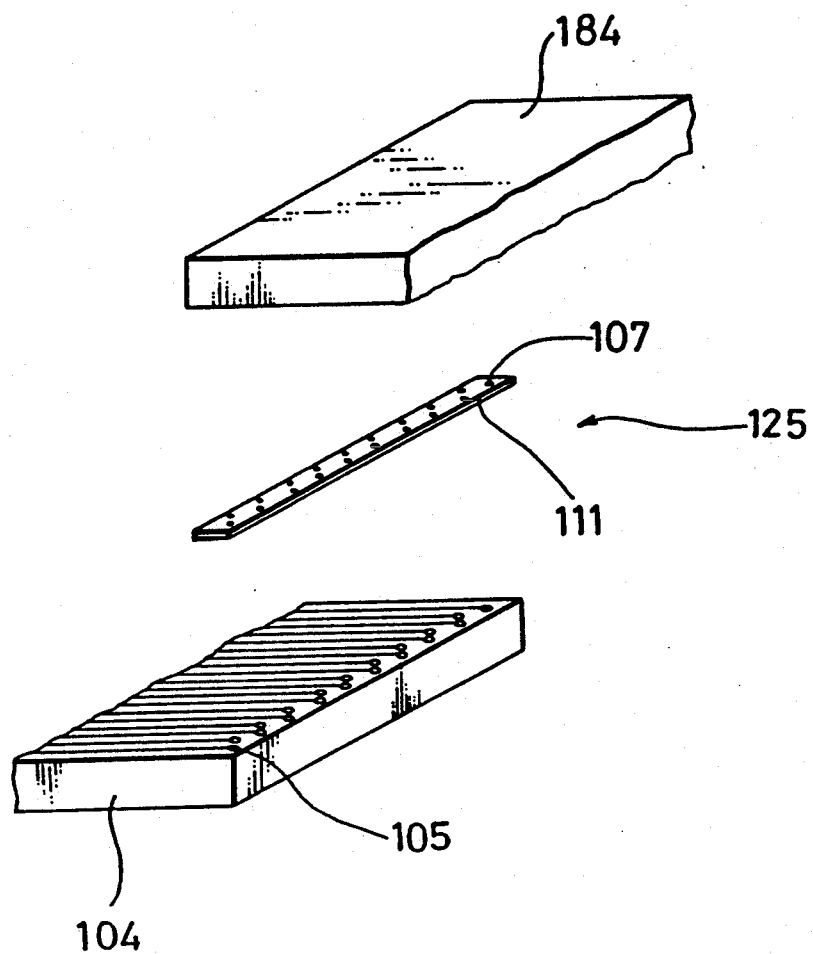
Figures 2, 5C:
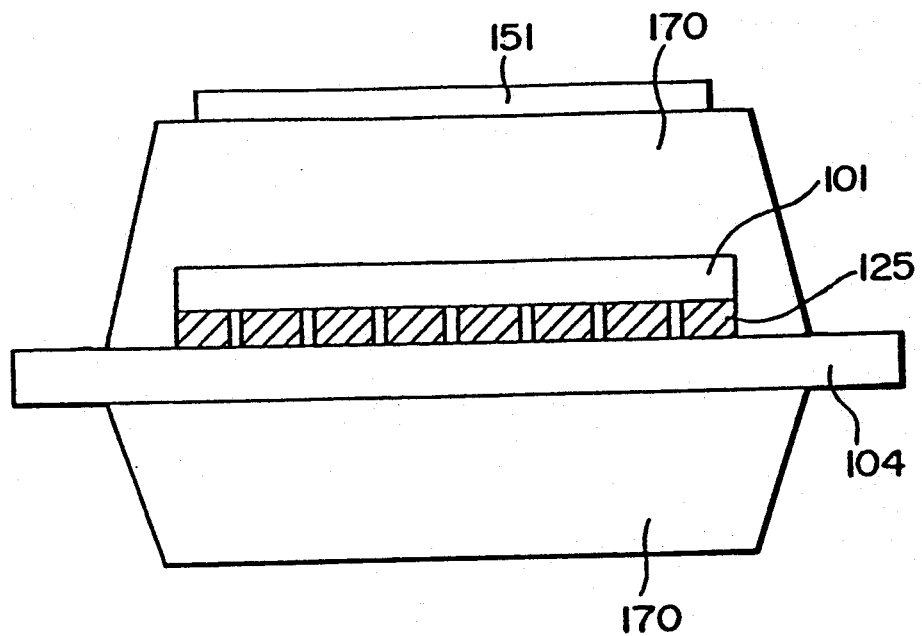
Figures 3, 5C:
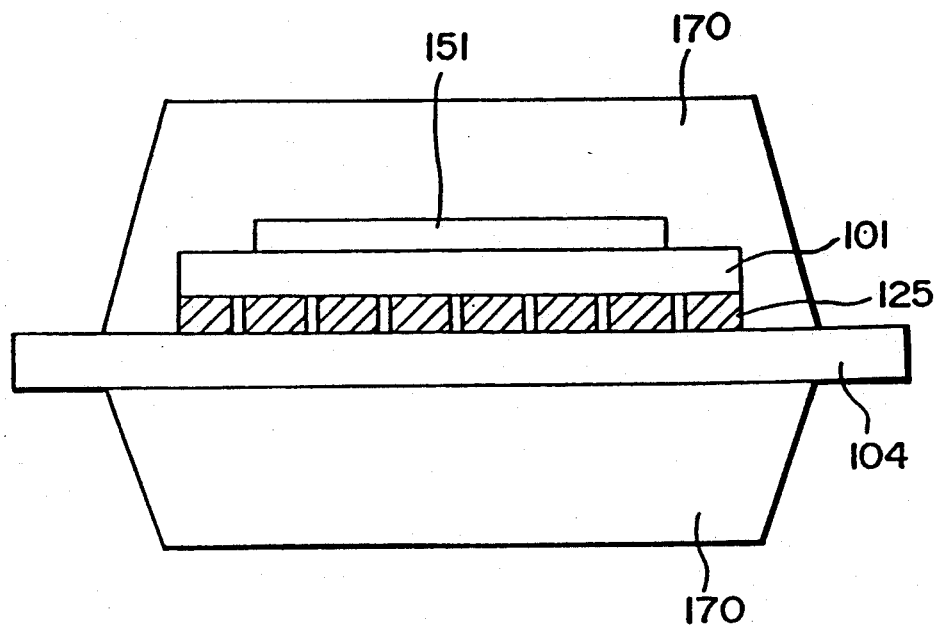
Figures 4, 5C:
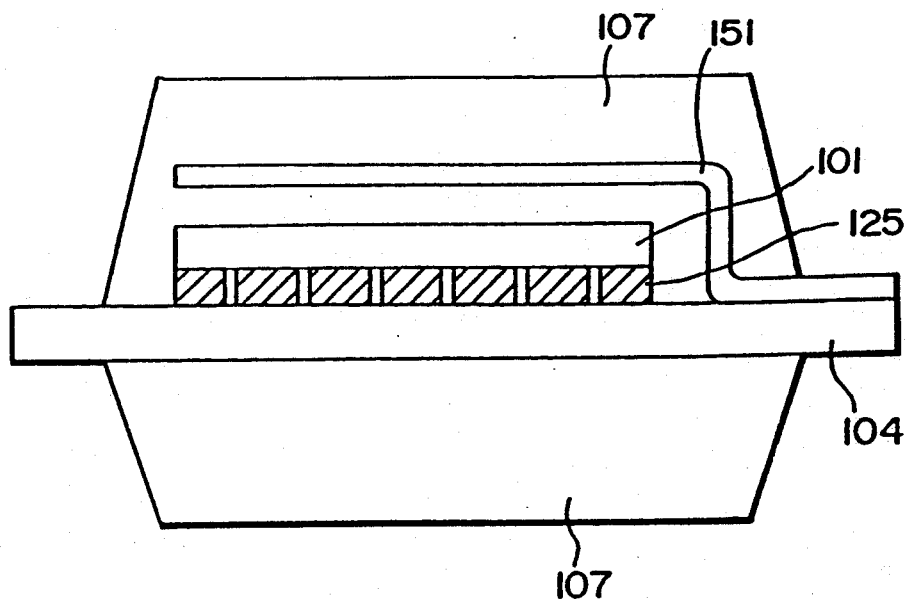
Figures 5, 5C:
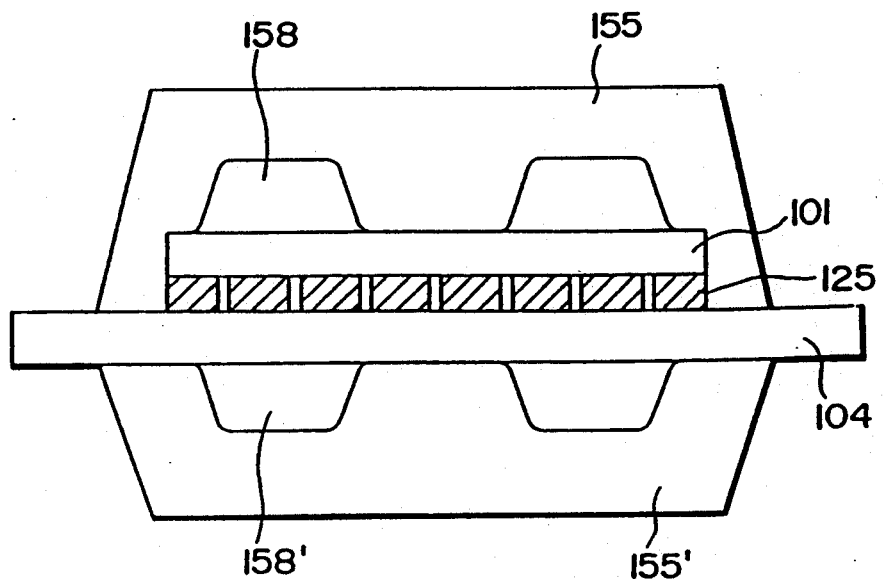
Figures 5, 5C, 6:
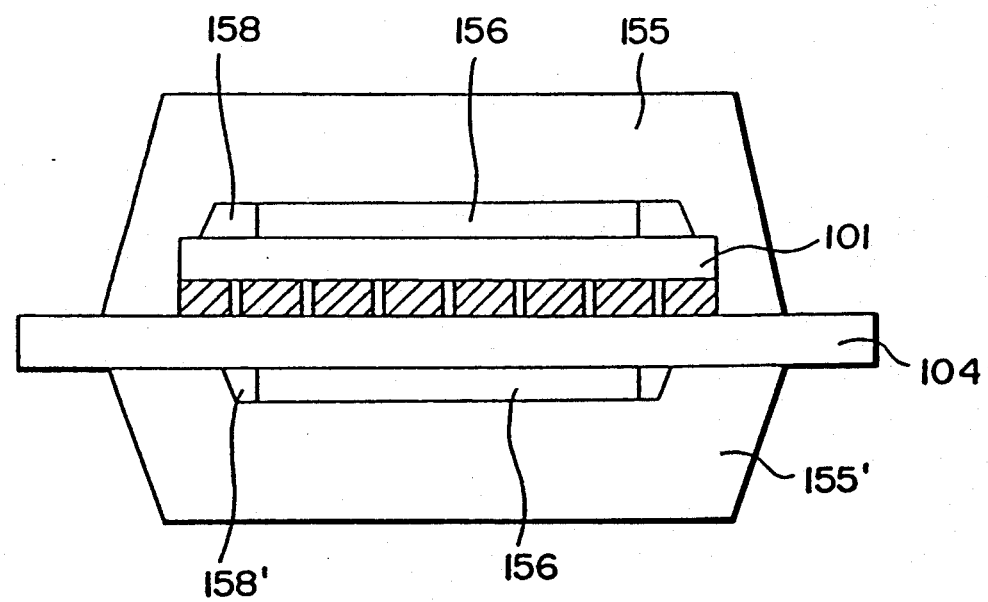

FIG. 6 shows an example of the production method.

Figure 6A:
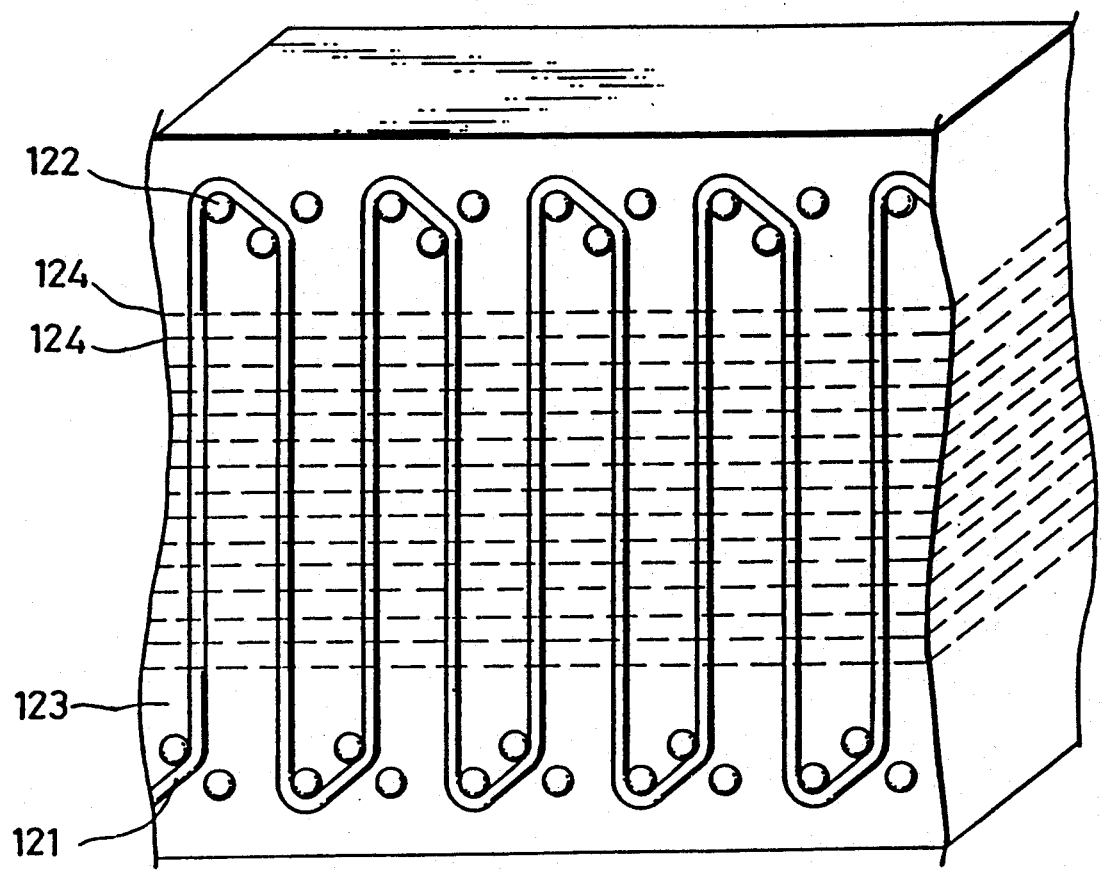
FIG. 6(a) is a cross-sectional view.
Figure 6B:
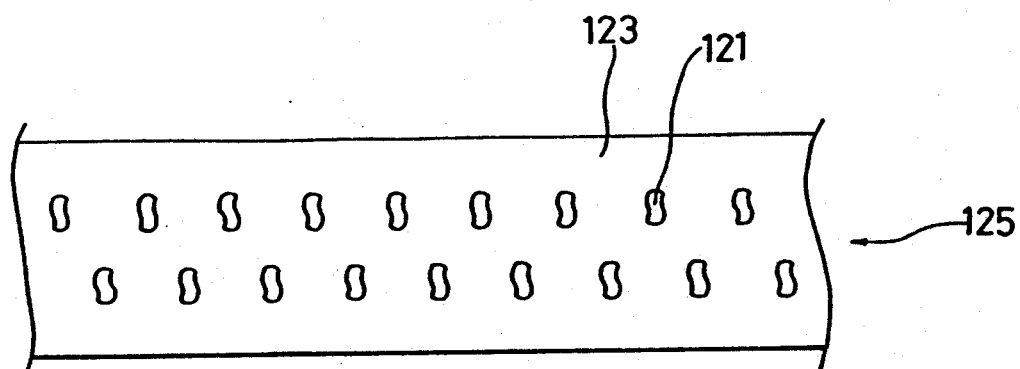
FIG. 6(b) is a plan view.
Figure 6C:
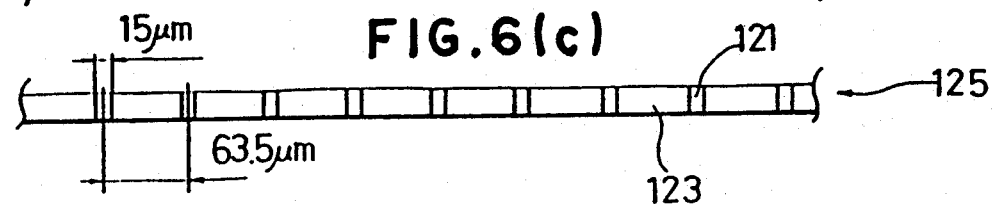
FIG. 6(c) is a cross-sectional view and FIG. 6(d) is a plan view.
Figure 6D:
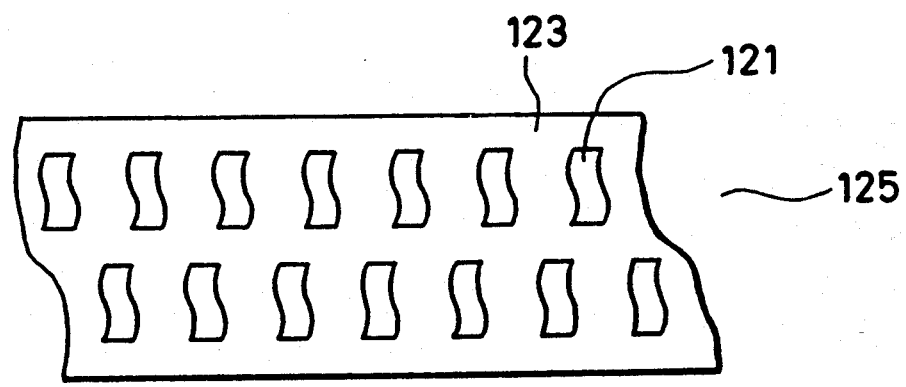

First, as shown in FIG. 6(a), a metal wire 121 consisting of a metal, such as gold, or an alloy having a wave-like form and a thickness of 30 $\mu m\ \phi$ at maximum is wound around rods 122 at a pitch of 63.5 $\mu m$ in a zigzag form. After having been wound, the metal wire is buried in a resin 123, such as polyimide and the like. After having been buried, the resin 123 is hardened. The hardened resin 123 becomes an insulator. Subsequently, the resultant body is sliced at positions 124 to prepare the electric connecting members 125. The electric connecting member 125 thus prepared is shown in FIGS. 6(b), 6(c) and 6(d). The thickness and shape of the metal wires in FIG. 6(d) is different from those of the metal wires in FIGS. 6(b) and 6(c).

In the electric connecting member 125 thus prepared, the metal wires 121 constitute the metal members 107, and the resin 123 constitutes the support member (insulator) 111.

In the electric connecting member 125, the metal wires as the metal members are insulated one another with the resin 123. One ends of the metal wires 121 are exposed at the side of the circuit substrate 104, and another ends are exposed at the side of the circuit substrate 184. The exposed portions are connected to the connecting regions 105 of the circuit substrate 104 and the connecting regions 194 of the circuit substrate 184, respectively.

Next, as shown in FIGS. 5(a) and 5(c), the circuit substrate 104, the electric connecting member 125 and the circuit substrate 184 are prepared. The circuit substrates 104 and 184 used in the present embodiment have many connecting regions 105 and 194 in respective inner portion.

At the connecting regions 105 of the circuit substrate 104, a metal is exposed at positions corresponding to the connecting regions 194 of the circuit substrate 184 and the connecting regions 108 and 109 of the electric connecting member 125.

Figure 5D:
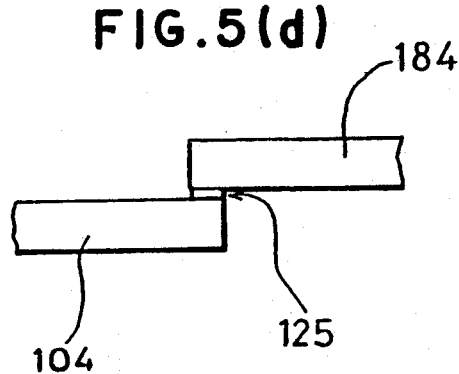

A locating is performed so that the connecting regions 105 of the circuit substrate 104 and the connecting regions 108 of the electric connecting member 125, or the connecting regions 194 of the circuit substrate 184 and the connecting regions 109 of the electric connecting member 125 correspond to one another. After the locating, Au on the connecting regions 105 of the circuit substrate 104 and Au on the connecting regions 108 of the electric connecting member 125, and Au on the connecting regions 194 of the circuit substrate 184 and Au on the connecting regions 109 of the electric connecting member 125 are connected together (FIGS. 5(b) and 5(d)).

In the present embodiment, connection by pressing is performed, but connection may also be performed by metallizing and/or alloying two surfaces or one surface of the electric connecting member.

In order to connect together the circuit substrate 104, the electric connecting member 125 and the circuit substrate 184 by metallization and/or alloy formation, there are the following three methods. Any of these methods may be used.

1) A method in which, after locating the circuit substrate 104, the electric connecting member 125 and the circuit substrate 184 to one another, the connecting regions 105 of the circuit substrate 104 and the connecting regions 108 of the electric connecting member 125, and the connecting regions 194 of the circuit substrate 184 and the connecting regions 109 of the electric connecting regions 125 are connected together by metallization and/or alloy formation.

2) A method in which, after locating the circuit substrate 104 and the electric connecting member 125 to each other, the connecting regions 105 of the circuit substrate 104 and the connecting regions 108 of the electric connecting member 125 are connected together by metallization and/or alloy formation, and the circuit substrate 184 is then located, and the connecting regions 109 of the electric connecting member 125 and the connecting regions 194 of the circuit substrate 184 are connected together by metallization and/or alloy formation.

3) A method in which, after locating the circuit substrate 184 and the electric connecting member 125 to each c other, the connecting regions 194 of the circuit substrate 184 and the connecting regions 109 of the electric connecting member 125 are connected together by metallization and/or alloy formation, and the circuit substrate 104 is then located, and the connecting regions 108 of the electric connecting member 125 and the connecting regions 105 of the circuit substrate 104 are connected together by metallization and/or alloy formation.

For electric circuit devices prepared as described above, connectability of their connecting regions was investigated, and it was confirmed that they are connected together with a high reliability.

Moreover, reliability of various characteristics was excellent.

EXAMPLE 1-D2

Figure 2:
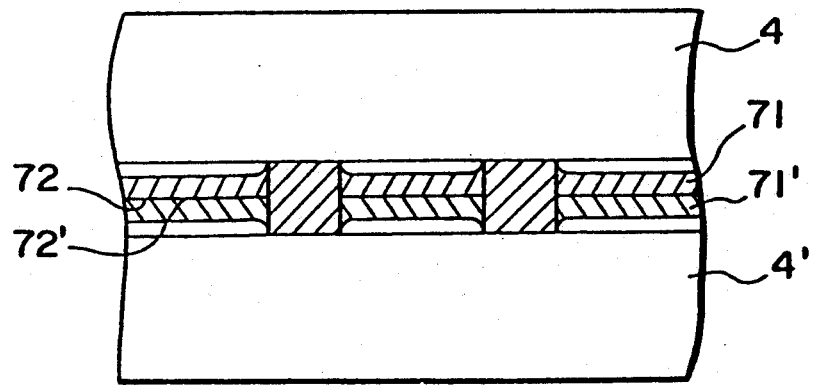

FIG. 5(c)-2 shows Example 1-D2.

In the present embodiment, a plate 151 made of stainless steel and having a thickness of 0.1 mm is connected by adhesive to the surface of a sealant 170 at one side in the case of Example 1-D1.

Other conditions are identical to those in Example 1-D1.

EXAMPLE 1-D3

Figure 3:
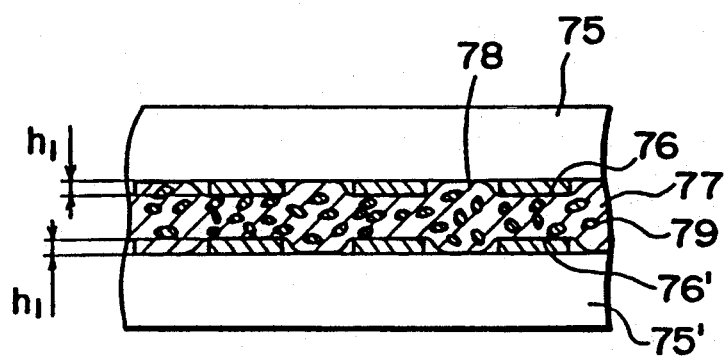

FIG. 5(c)-3 shows Example 1-D3.

In the present embodiment, a plate 151 made of stainless steel and having a thickness of 0.1 mm is connected by adhesive to the surface opposite to the electric connecting member 125 of a semiconductor device 101 in the case of Example 1-D1. In the present embodiment, the plate 151 is connected only to the semiconductor device 101.

Other conditions are identical to those in Example 1-D1.

EXAMPLE 1-D4

Figure 4:
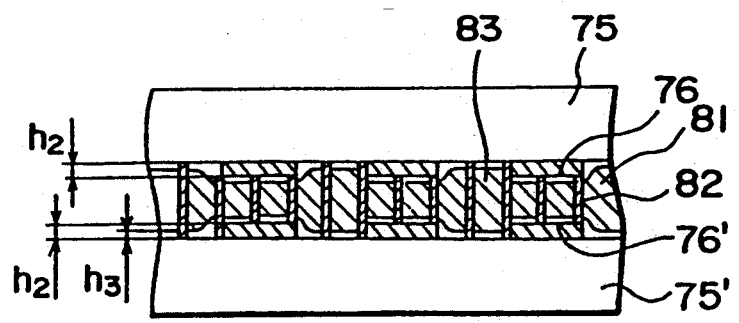

FIG. 5(c)-4 shows Example 1-D4.

In the present embodiment, a plate 151 made of stainless steel and having a thickness of 0.1 mm is disposed near a semiconductor device 101 in the case of Example 1-D1.

Other conditions are identical to those in Example 1-D1.

EXAMPLE 1-E1

FIG. 5(c)-5 shows Example 1-E1.

In the present embodiment, a semiconductor device 101 and the circuit substrate 104 are both subjected to cap sealing in the case of Example 1-D1. For caps, as shown in FIG. 5(c)-5, caps 155 and 155' each having two recesses in its inner portions are used. Recessed portions of the caps form hollow portions 158 and 158', and protruded portions of the caps contact the back surfaces of the semiconductor device 101 and the circuit substrate 104. The semiconductor device 101 and the circuit substrate 104 are firmly held to the electric connecting member 125.

In the present embodiment, the caps 155 and 155' are connected together by an adhesive.

Other conditions are identical to those in Example 1-D1.

EXAMPLE 1-E2

FIG. 5(c)-6 shows Example 1-E2.

In the present embodiment, members for adjustment are provided between the semiconductor device 101 and the cap 156, and between the circuit substrate 104 and the cap 156 and, cap sealing is then performed in the case of Example 1-E1.

Other conditions are identical to those in Example 1-E1.

EXAMPLE 2-D1

Figure 7A:
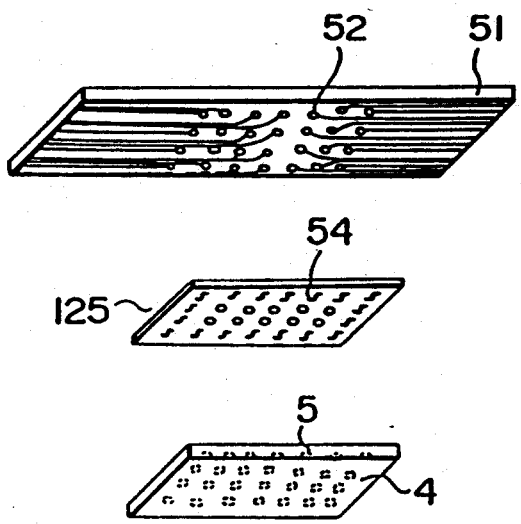
Figures 1, 7B:
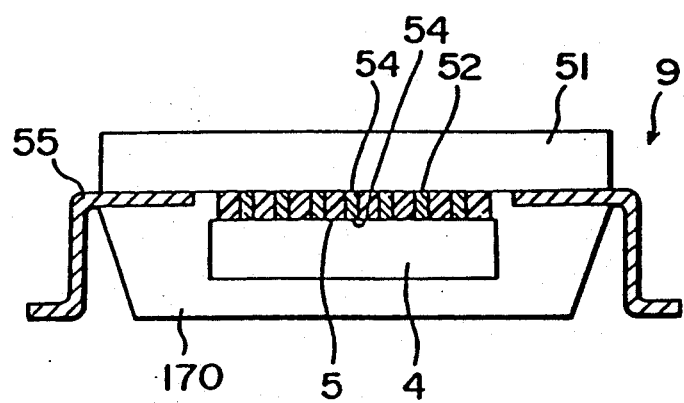
Figures 2, 7B:
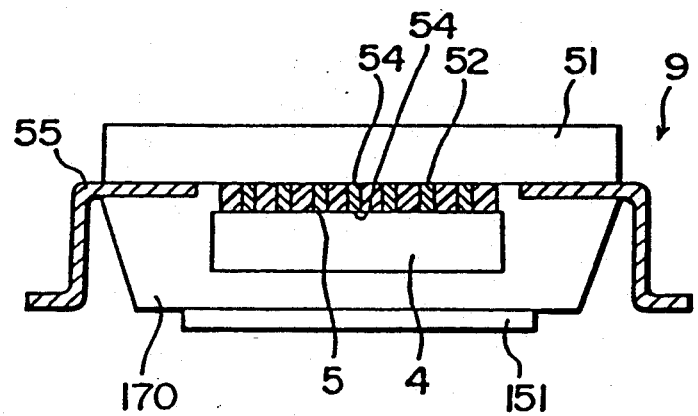
Figures 3, 7B:
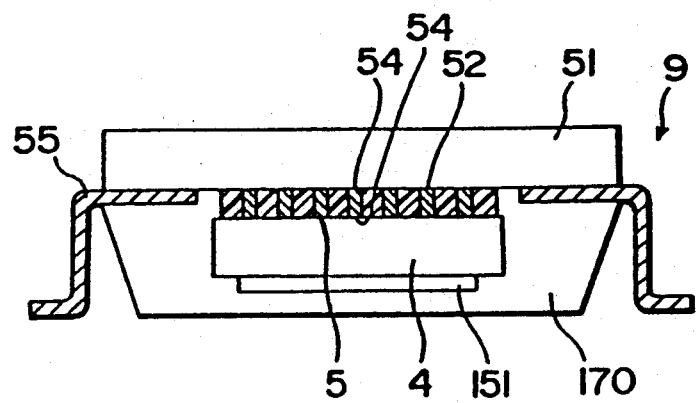
Figures 4, 7B:
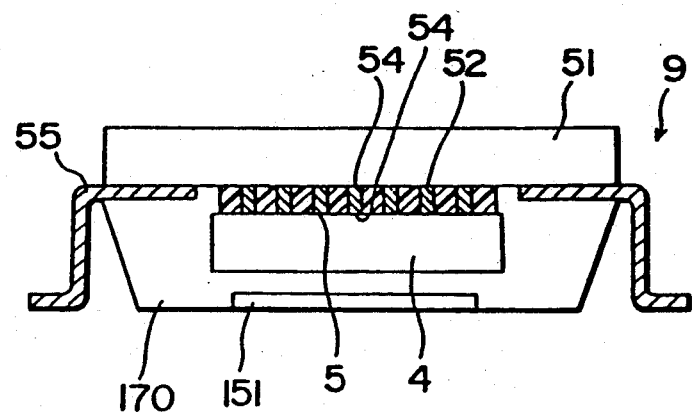
Figures 5, 7B:
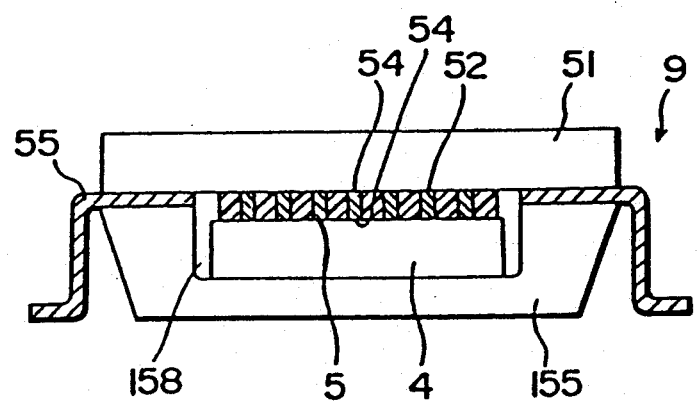
Figures 6, 7B:
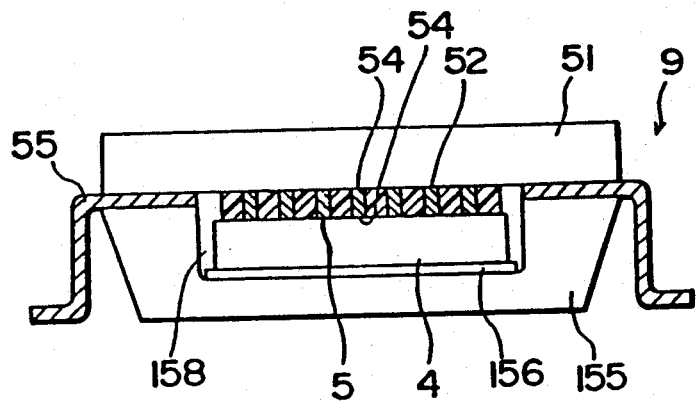

FIGS. 7(a) and 7(b)-1 show Example 2-D1.

In the present embodiment, among metal wires 54 of the electric connecting member, those the outer circumferential portions have an S-like shape. Metal wires at inner portions of the support member have a circular shape. A circuit substrate 51 was used as a first electric circuit component having connecting regions 52, and a semiconductor device 4 having many connecting regions 5 in its inner portions was used as a second electric circuit component.

In the present embodiment, the electric connecting member 125 in which a powder consisting of $SiO_2$ (not illustrated) is dispersed within the support member consisting of an organic material was used.

Furthermore, in the present embodiment, the connecting regions 54 of this electric connecting member and the connecting regions 52 of the circuit substrate 51 were connected together by metallization and/or alloy formation. On the other hand, the electric connecting member 125 and the semiconductor device 4 were connected together by a connection method other than metallization and/or alloy formation. That is, the semiconductor device 4 was pressed to the electric connecting member 125 and temporarily held by an adhesive and the like, and sealing was then performed from thereon.

The electric connecting member 125 having a size which corresponds to that of the semiconductor device 4 was used.

In the present embodiment, a lead frame 55 was connected to the lower surface of the circuit substrate 51.

Furthermore, in the present embodiment, only the semiconductor device 4 was sealed. A sealant in which a powder consisting of $SiO_2$ is dispersed in a thermoplastic resin was used.

Other conditions are identical to those in Example 1-D1.

In the present embodiment as well, the connecting regions were connected with a high reliability.

Furthermore, reliability of various characteristics was excellent.

EXAMPLE 2-D2

FIG. 7(b)-2 shows Example 2-D2.

In the present embodiment, a plate made of stainless steel and having a thickness of 0.1 mm is connected by adhesive on a surface of a sealant 170 in the case of Example 2-D1.

Other conditions are identical to those in Example 2-D1.

EXAMPLE 2-D3

FIG. 7(b)-3 shows Example 2-D2.

In the present embodiment, a plate 151 made of stainless steel and having a thickness of 0.1 mm is connected by adhesive to the surface opposite to the electric connecting member 125 of the semiconductor device 4 in the case of Example 2-D1. In the present embodiment, the plate 151 is connected only to the semiconductor device 4.

Other conditions are identical to those in Example 2-D1.

EXAMPLE 2-D4

FIG. 7(b)-4 shows Example 2-D4.

In the present embodiment, a plate 151 made of stainless steel and having a thickness of 0.1 mm is disposed near the semiconductor device 4 in the case of Example 2-D1. In the present embodiment, sealing is performed except a surface of the plate 151, that surface being exposed to the outside.

Other conditions are identical to those in Example 1-D1.

EXAMPLE 2-E1

FIG. 7(b)-5 shows Example 2-E1.

In the present embodiment, the semiconductor device 4 was subjected to cap sealing by a cap 155 in the case of Example 2-D1.

As shown in FIG. 7(b)-5, the cap 155 having a recess in its inner portion is used. Using the cap 155, cap sealing is performed so that hollow portions 158 are formed at both sides of the semiconductor device 4. In the present embodiment, only the semiconductor device 4 is subjected to cap sealing.

Other conditions are identical to those in Example 2-D1.

EXAMPLE 2-E2

FIG. 7(b)-6 shows Example 2-E2.

In the present embodiment, a member 156 for adjustment is provided between the semiconductor device 4 and the cap 155 and cap sealing is then performed in the case of Example 1-E1.

Other conditions are identical to those in Example 1-E1.

EXAMPLE 3-D1

Figures 1, 8A:
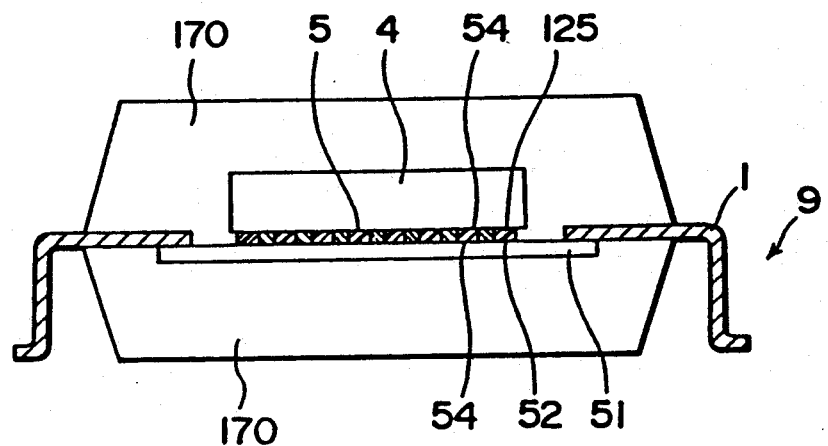
Figures 2, 8A:
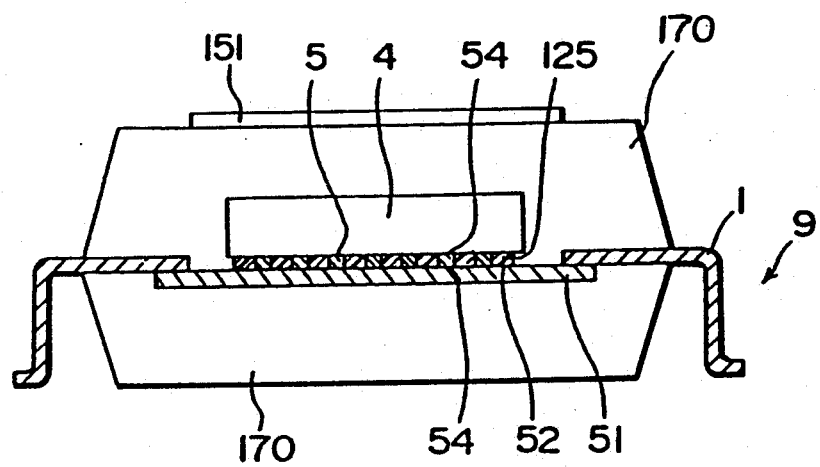
Figures 3, 8A:
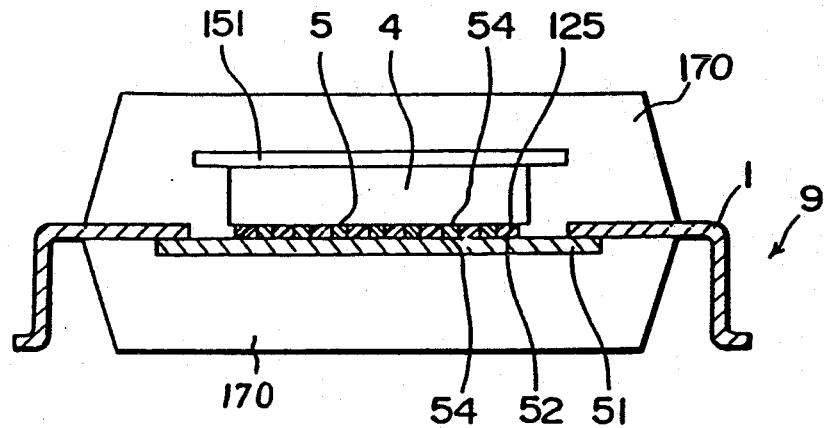
Figures 4, 8A:
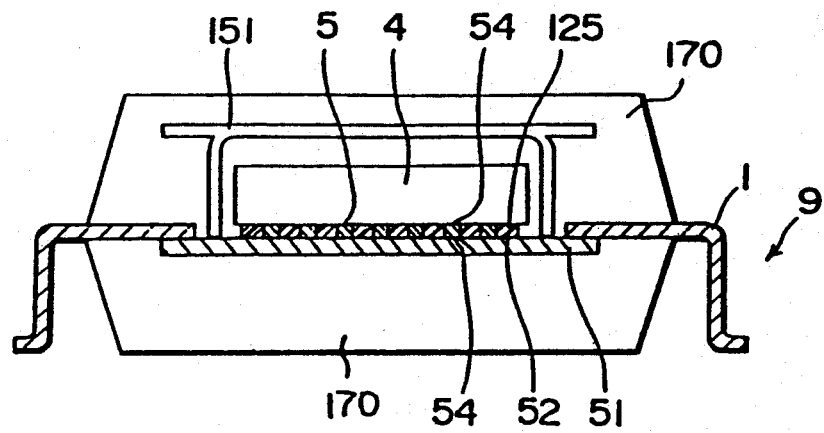
Figures 5, 8A:
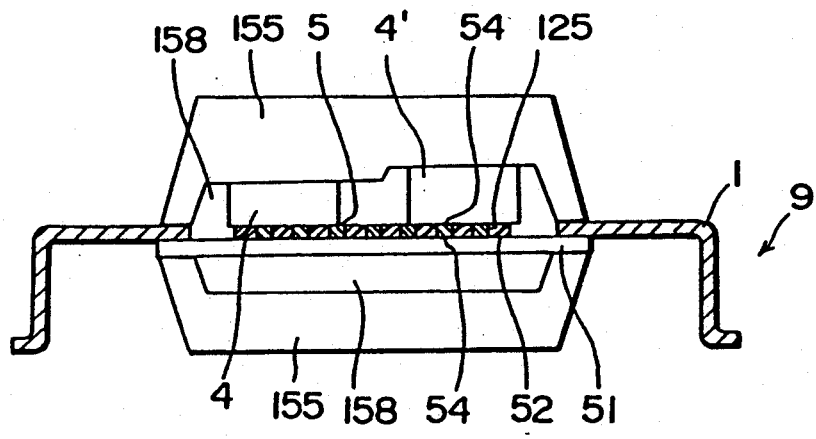
Figures 6, 8A:
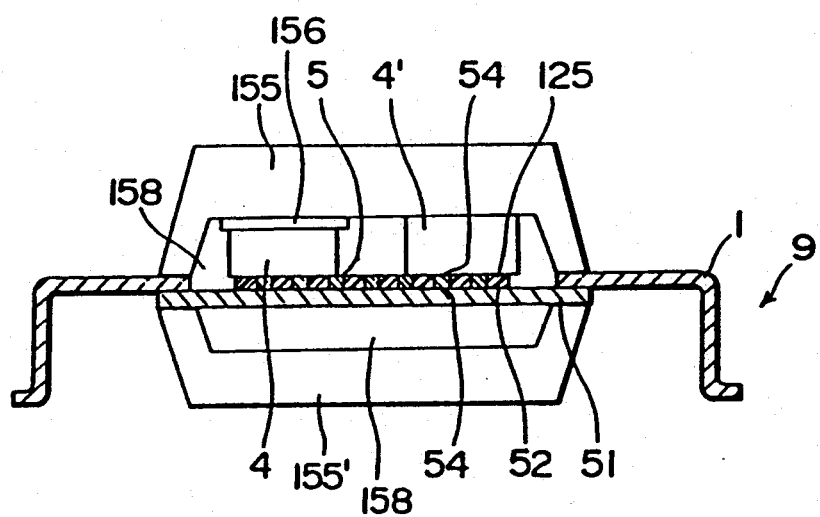
Figures 1, 8B:
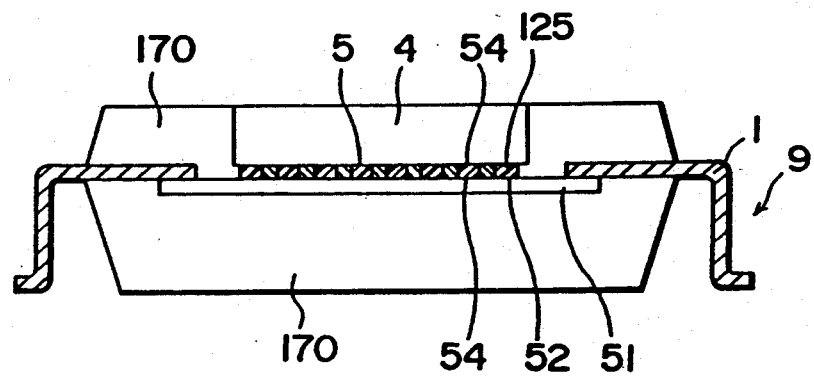
Figures 2, 8B:
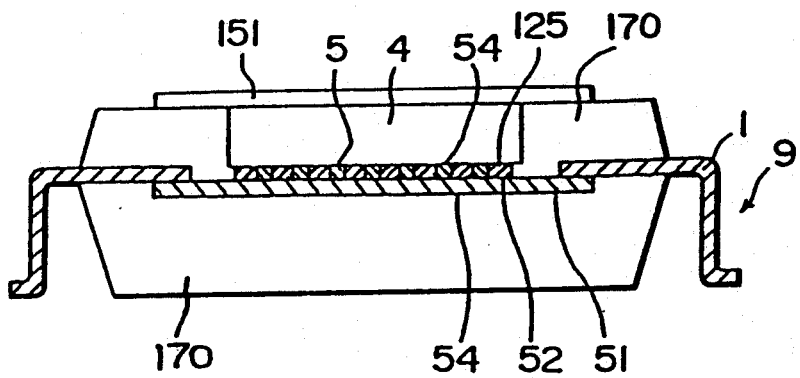
Figures 3, 8B:
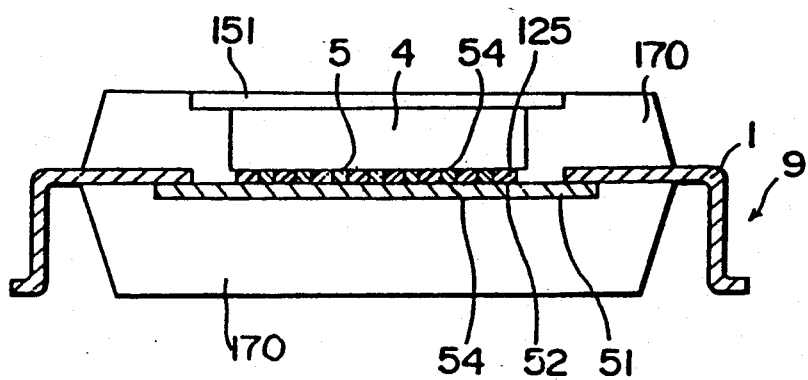
Figures 4, 8B:
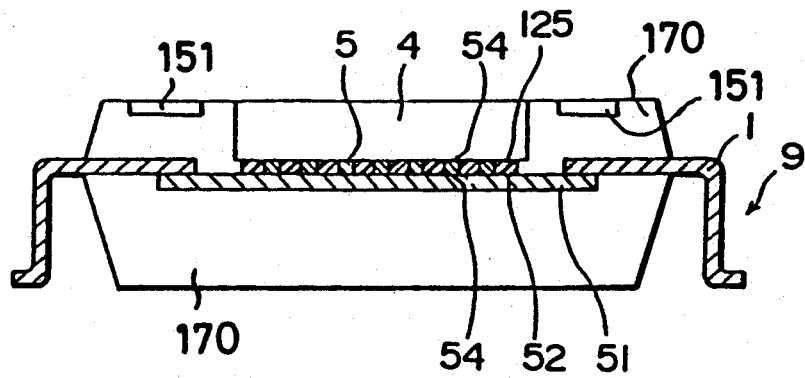
Figures 5, 8B:
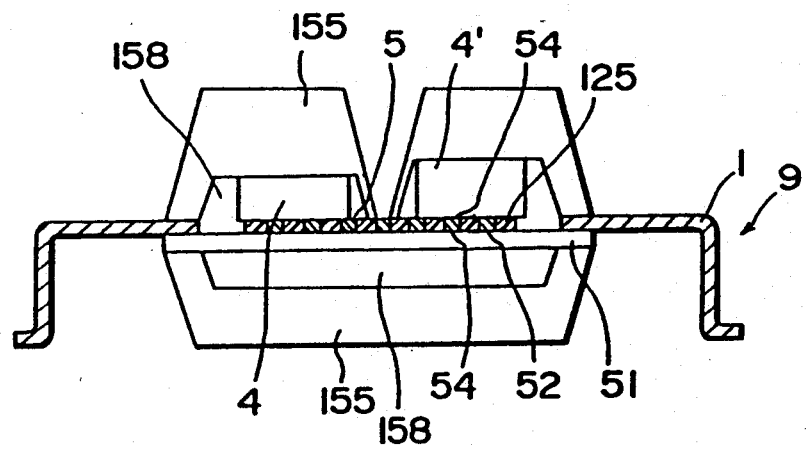

FIGS. 8(a)-1 and 8(b)-1 show Example 3-D1.

The present embodiment is an example in which a first electric circuit component is the semiconductor device 4, and a second electric circuit component is the circuit substrate 51.

After connection, a lead frame 1 is connected on the upper surface of the circuit substrate 51. The electric circuit member is then set within a cavity of a mold, and injection molding is performed to form the sealant 170.

FIG. 8(a)-1 is an example in which the semiconductor device 4 is totally buried by the sealant, and FIG. 8(b)-1 is an example in which the upper surface of the semiconductor device 4 is exposed to the outside, and side portions of the device are buried by a sealant.

Other conditions are identical to those in Example 1-D1.

In the present embodiment as well, connecting regions are connected with a high reliability.

Furthermore, reliability of various characteristics is also excellent. 1

EXAMPLE 3-D2

FIG. 8(a)-2 shows Example 3-2D.

In the present embodiment, a plate 151 made of stainless steel and having a thickness of 0.1 mm is connected by adhesive to a surface of the sealant 170 at one side in the case of Example 3-D1.

Other conditions are identical to those in Example 3-D1.

FIG. 8(b)-2 shows a modified example of Example 3-D2.

In the present modified example, one sheet of a plate 151 was connected by adhesive to a surface of the sealant 170 and the exposed surface of the semiconductor device 4 in the case of the modified example of Example 3-D1.

Other conditions are identical to those in the modified example of Example 3-D1.

EXAMPLE 3-D3

FIG. 8(a)-3 shows Example 3-D3.

In the present embodiment, a plate 151 made of stainless steel and having a thickness of 0.1 mm is connected by adhesive to the surface opposite to the electric connecting member 125 of the semiconductor device 4 in the case of Example 3-D1.

Other conditions are identical to those in Example 3-D1.

FIG. 8(b)-3 shows a modified example of Example 3-D3.

In the present modified example, the plate 151 is connected by adhesive to the exposed surface of the semiconductor device 4 in the case of the modified example of Example 3-D1. The surface opposite to the semiconductor device of the plate 151 is exposed to the outside.

Other conditions are identical to those in the modified example of Example 3-D1.

EXAMPLE 3-D4

FIG. 8(a)-4 shows Example 3-D4.

In the present embodiment, an assembled body of plates 151 made of stainless steel and having a thickness of 0.1 mm is disposed near the semiconductor device 4 in the case of Example 3-D1. In the present embodiment, the assembled body of plates 151 is disposed so that it encloses surroundings of the semiconductor device 4.

Other conditions are identical to those in Example 3-D1.

FIG. 8(b)-4 shows a modified example of Example 3-D4.

In the present modified example, plates 151 are disposed at both sides of the semiconductor device 4, respectively, in the case of the modified example of Example 3-D1. One surface of each plate 151 is exposed to the outside.

Other conditions are identical to those in the modified example of Example 3-D1.

EXAMPLE 3-E1

FIG. 8(a)-5 shows Example 3-E1.

In the present embodiment, two semiconductor devices 4 and 4' are provided at heights which are different from each other, and these two semiconductor devices 4 and 4' are subjected to cap sealing.

As shown in FIG. 8(a)-5, a cap 155 having a stepped recess in its inner portion is used. Using the cap 155, cap sealing is performed so that hollow portions 158 are formed at both sides of the semiconductor devices 4 and 4'.

Other conditions are identical to those in Example 3-D1.

FIG. 8(b)-5 shows a modified example of Example 3-E1.

In the present modified example, the semiconductor devices 4 and 4' are separately subjected to cap sealing.

Other conditions are identical to those in the present embodiment.

EXAMPLE 3-E2

FIG. 8(a)-6 shows Example 3-E2.

In the present example, a member 156 for adjustment is provided between the semiconductor device 4 and the cap 156 and cap sealing is then performed in the case of Example 3-E1.

Other conditions are identical to those in Example 3-E1.

EXAMPLE 4-D1

Figures 1, 9A:
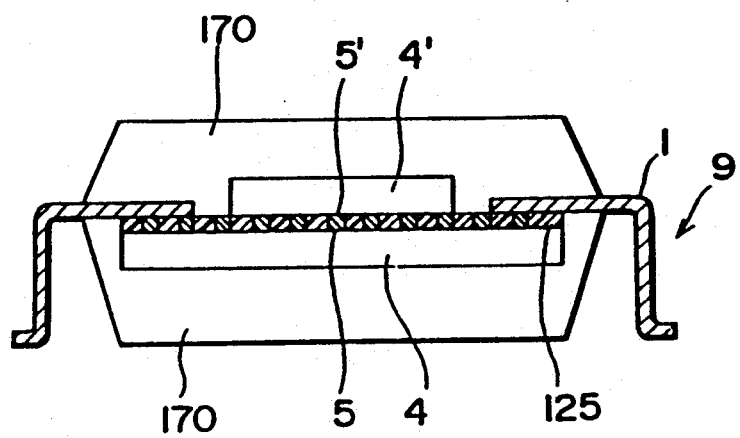
Figures 2, 9A:
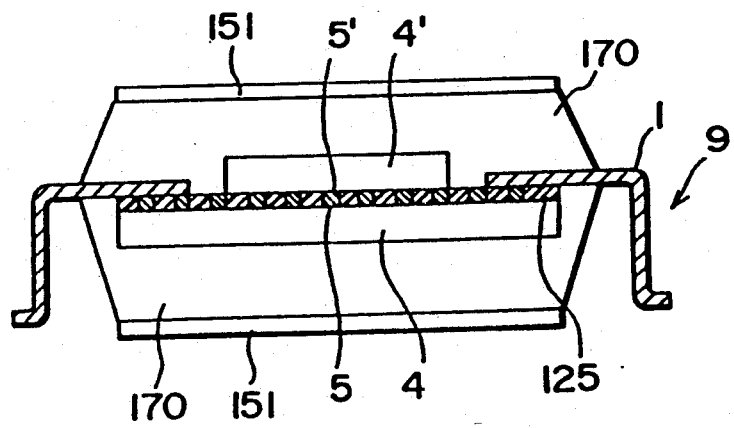
Figures 3, 9A:
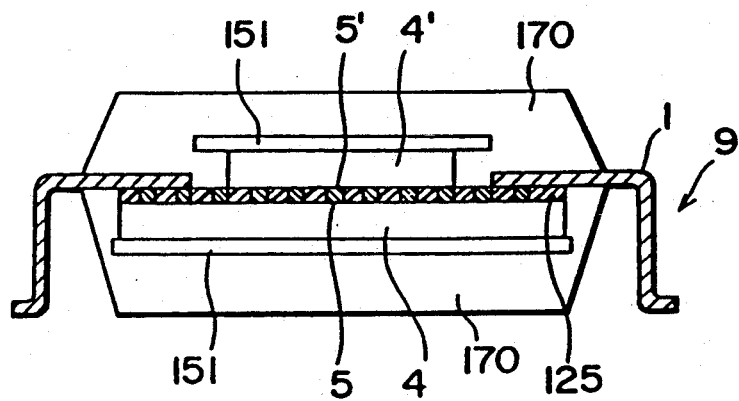
Figures 4, 9A:
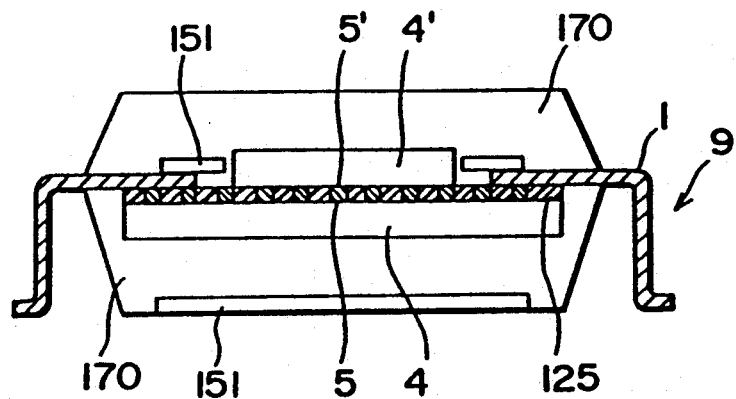
Figures 5, 9A:
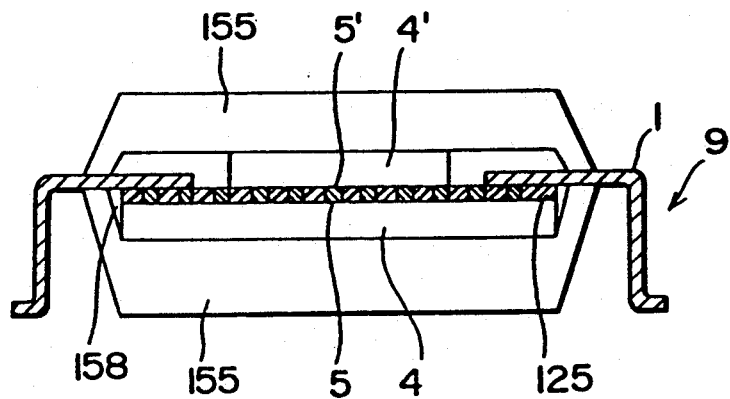
Figures 6, 9A:
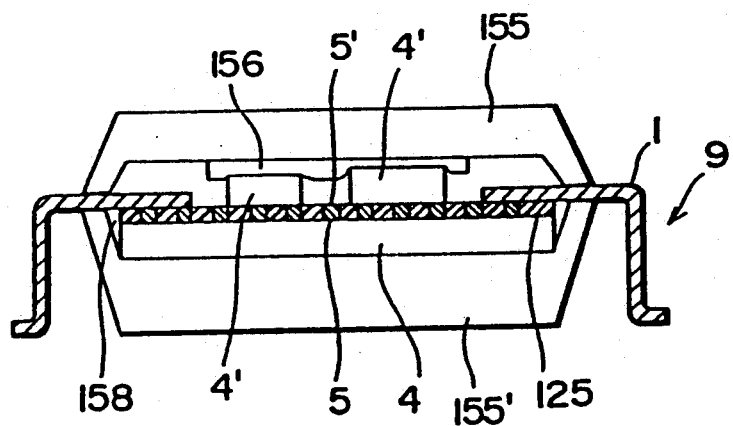

FIG. 9(a)-1 shows Example 4-D1.

The present embodiment is an example in which a first electric circuit component is the semiconductor device 4', and a second electric circuit component is the semiconductor device 4. In the present embodiment, an electric connecting member the size of which corresponds to that of the semiconductor device 4 is used, and a lead frame 1 is connected to a metal member exposed at the side of the first semiconductor device 4' of the electric connecting member 125.

Figures 1, 9B:
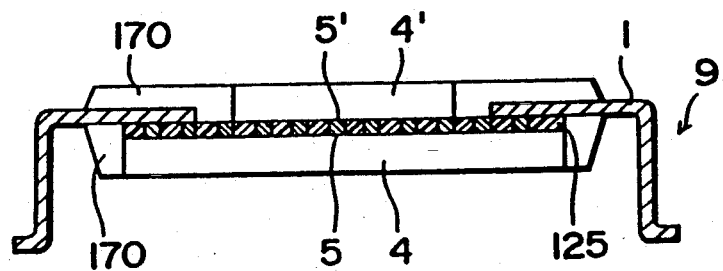
Figures 2, 9B:
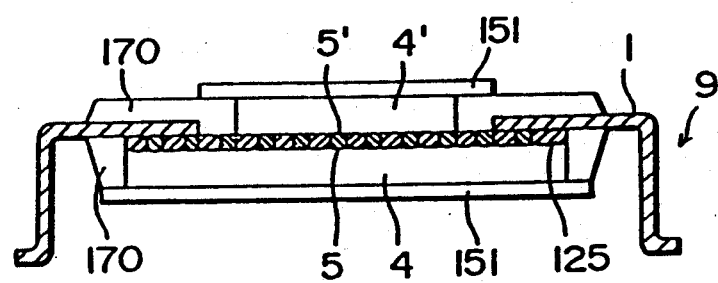
Figures 3, 9B:
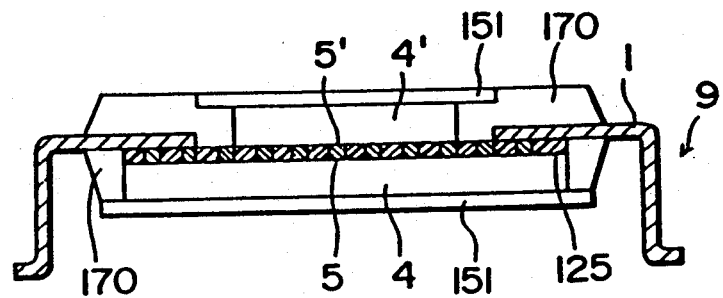
Figures 4, 9B:
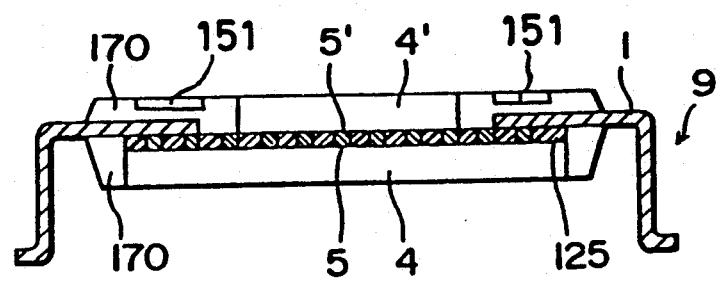

As an insulator for the electric connecting member 125, an organic material, in which one or both of a metal powder and metal fibers are dispersed, is used. Furthermore, FIG. 9(b)-1 shows a case in which both devices are not connected by metallization and/or alloy formation. When sealing, sealing is performed by pressing the semiconductor devices 4 and 4' (not illustrated).

It is to be noted that FIG. 9(a)-1 is a case in which the semiconductor devices 4 and 4' are totally buried by a sealant, and FIG. 9(b)-1 is a case in which the upper surfaces of the semiconductor devices 4 and 4' are exposed to the outside, and side portions of the devices are buried by a sealant.

Other conditions are identical to those in Example 3-D1.

In the present embodiment as well, connecting regions are connected with a high reliability.

Furthermore, reliability in various characteristics is also excellent.

EXAMPLE 4-D2

FIG. 9(a)-2 shows Example 4-D2.

In the present embodiment, a plate 151 made of stainless steel and having a thickness of 0.1 mm is connected by adhesive to surfaces of sealants 170 at both sides in the case of Example 4-D1.

Other conditions are identical to those in Example 4-D1.

FIG. 9(b)-2 shows a modified example of Example 4-D2.

In the present modified example, one sheet of plate 151 is connected by adhesive to a surface of the sealant 170 and the exposed surface of the semiconductor device 4', and one sheet of plate 151 is also connected by adhesive to a surface of the sealant 170 and the exposed surface of the semiconductor device 4.

Other conditions are identical to those in the modified example of Example 4-D1.

EXAMPLE 4-D3

FIG. 9(a)-3 shows Example 4-D3.

In the present embodiment, a plate 151 made of stainless steel and having a thickness of 0.1 mm is connected by adhesive to the surface opposite to the electric connecting member 125 of the semiconductor device 4, and a plate made of stainless steel having a thickness of 0.1 mm is connected by adhesive to the surface opposite to the electric connecting member 125 of the semiconductor device 4' in the case of Example 4-D1.

Other conditions are identical to those in Example 4-D1.

FIG. 9(b)-3 shows a modified example of Example 4-D3.

In the present modified example, a plate 151 is connected by adhesive to the exposed surface of the semiconductor device 4, and a plate 151 is also connected by adhesive to the exposed surface of the semiconductor device 4. Surfaces of the plates 151 opposite to the semiconductor devices 4 and 4' are exposed to the outside.

Other conditions are identical to those in the modified example of Example 4-D1.

EXAMPLE 4-D4

FIG. 9(a)-4 shows Example 4-D4.

In the present embodiment, plates 151 made of stainless steel and having a thickness of 0.1 mm are disposed near both sides of the semiconductor devices 4', respectively, and a plate 151 is also disposed near the semiconductor device 4. One surface of the plate 151 disposed near the semiconductor device 4 is exposed to the outside.

Other conditions are identical to those in Example 4-D4.

FIG. 9(b)-4 shows a modified example of Example 4-D4.

In the present modified example, plates 151 are disposed at both sides of the semiconductor device 4', respectively, in the case of the modified example of Example 4-D1. One surface of each plate 151 is exposed to the outside.

Other conditions are identical to those in Example 4-D1.

EXAMPLE 4-E1

FIG. 9(a)-5 shows Example 4-E1.

In the present embodiment, the semiconductor devices 4 and 4' are subjected to cap sealing, respectively, in the case of Example 4-D1.

Other conditions are identical to those in Example 4-D1.

EXAMPLE 4-E2

FIG. 9(a)-6 shows Example 4-E2.

In the present embodiment, a member 156 for adjustment having steps is disposed between semiconductor devices 4' and 4' having different heights and a cap 155, and cap sealing is then performed in the case of Example 4-E1.

Other conditions are identical to those in Example 4-E1.

EXAMPLE 5

Figure 10A:
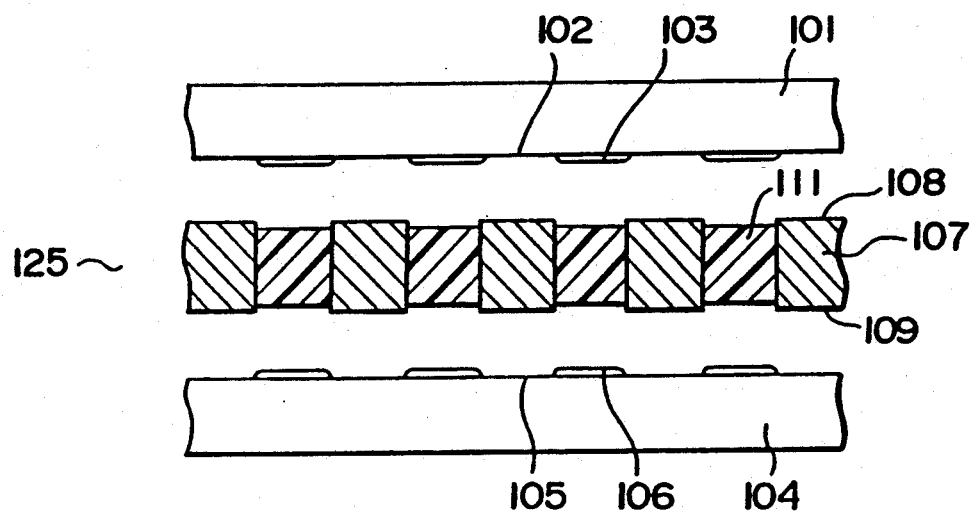
FIGS. 10(a) and 10(b) are cross-sectional views showing states before connection and after connection, respectively.
Figure 10B:
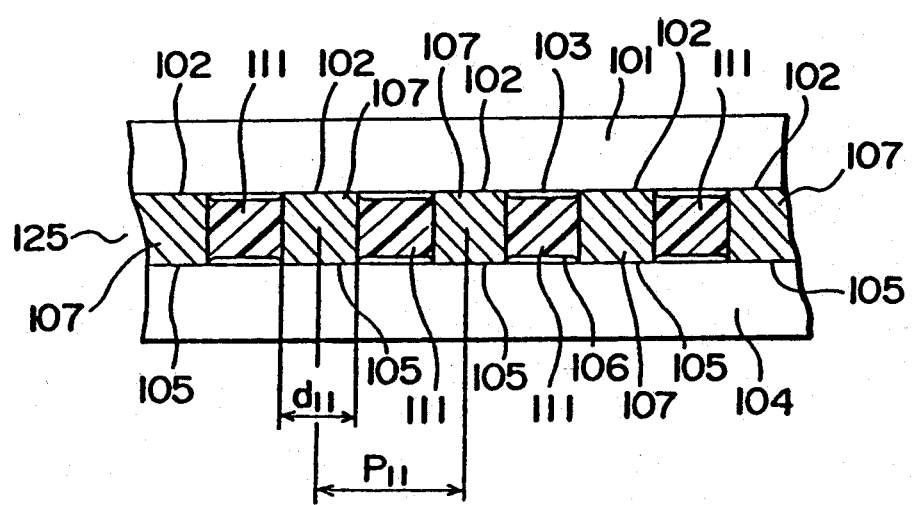

FIG. 10 shows Example 5.

Example 5 is an example in which circuit substrates 101 and 104, portions other than connecting regions of which are covered with insulating films 103 and 106, are used as a first circuit component and a second circuit component.

Figure 11A:
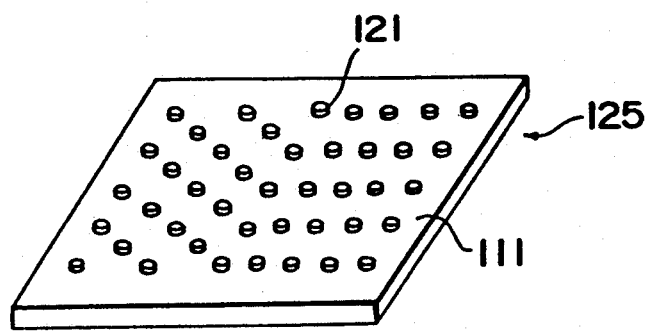
FIGS. 11(a) and 12(a) are perspective views.
Figure 11B:
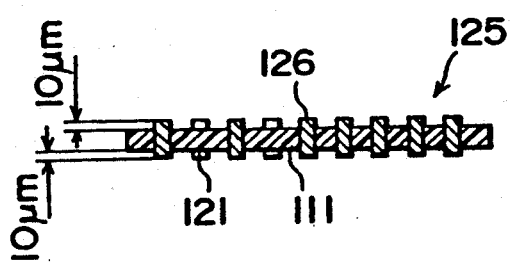
FIGS. 11(b) and 12(b) are cross-sectional views.

An electric connecting member as shown in FIG. 11 is used. That is, in the electric connecting member 125 shown in FIG. 11, a part of its metallic members 107 (metal wires 121) is arranged in a zigzag form, and exposed portions of the metal members 107 protrude from the surfaces of the support member (resin insulator) 111. Such an electric connecting member 125 may be produced, for example, by the following method.

First, by the method described in Example 1-D1, the electric connecting member shown in FIGS. 6(b) and 6(c) is prepared. Next, both sides of the electric connecting member may be etched until the metal wires 121 protrude about 10 μm from the polyimide resin 123.

Although the amount of protrusion is made to be 10 μm in the present embodiment, any amount may be selected.

Furthermore, the method for protruding the metal wires 121 is not limited to etching, but other chemical or mechanical methods may be used.

Other conditions are identical to those in Example 1-D1.

Figure 12A:
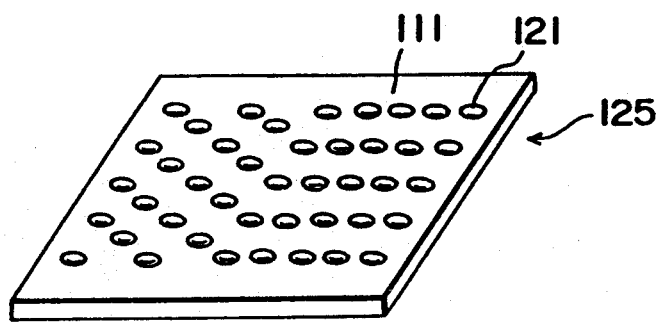
Figure 12B:
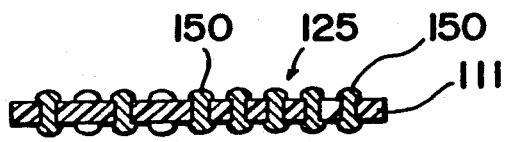

Relative to protrusion, bumps 150 as shown in FIG. 12 may also be formed by pinching the electric connecting member 125 in a mold having recesses at positions of the metal wires 121, and crushing protrusions 126 of the metal wires 121. In this case, the metal wires 121 hardly leave from the insulator 111.

It is to be noted that the metal wires 121 constitute the metal members 107, and the resin 123 constitutes the insulator 111.

The bumps may also be formed by fusing the protrusions by heat, or by any other method.

In the present embodiment as well, the connecting regions are connected with a high reliability.

Furthermore, reliability in various characteristics is excellent.

EXAMPLE 6-D1

Figure 13A:
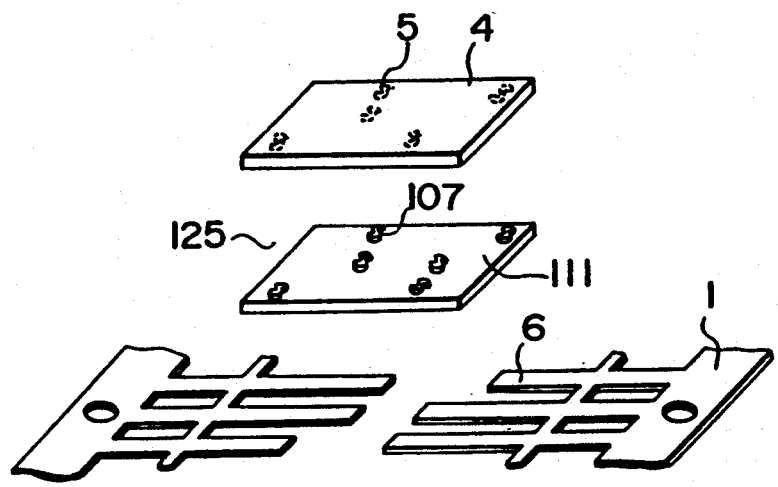
Figures 1, 13B:
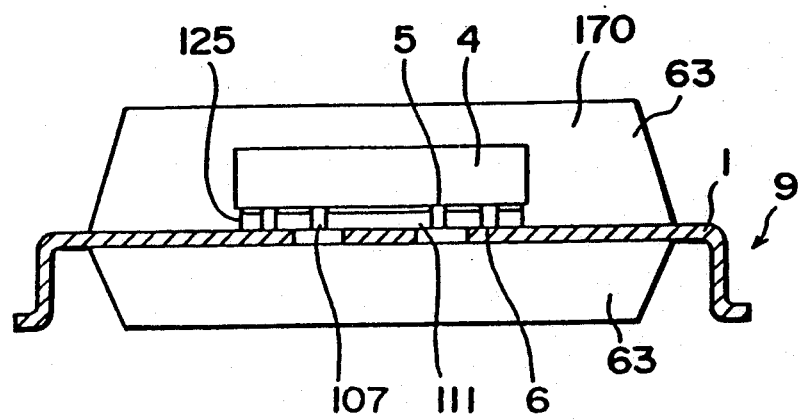
Figures 2, 13B:
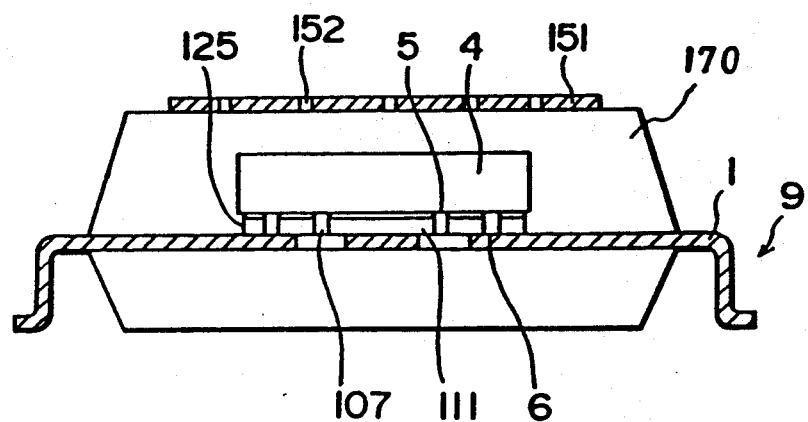
Figures 3, 13B:
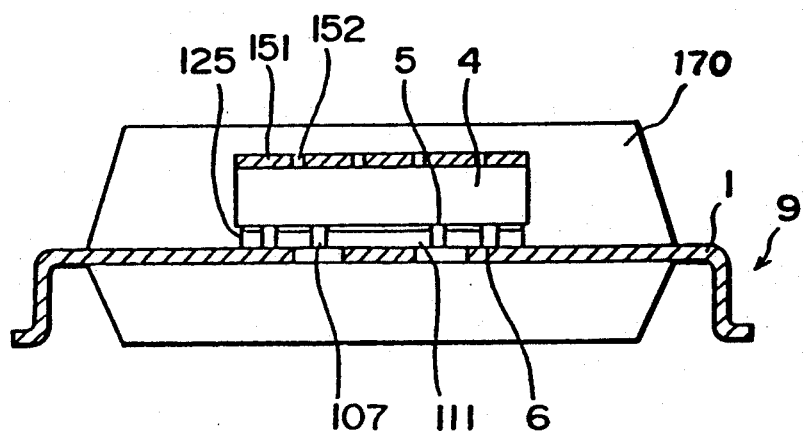
Figures 4, 13B:
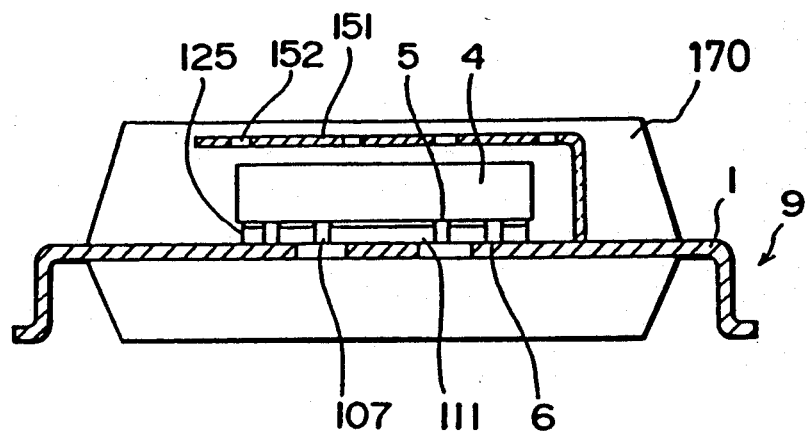
Figures 5, 13B:
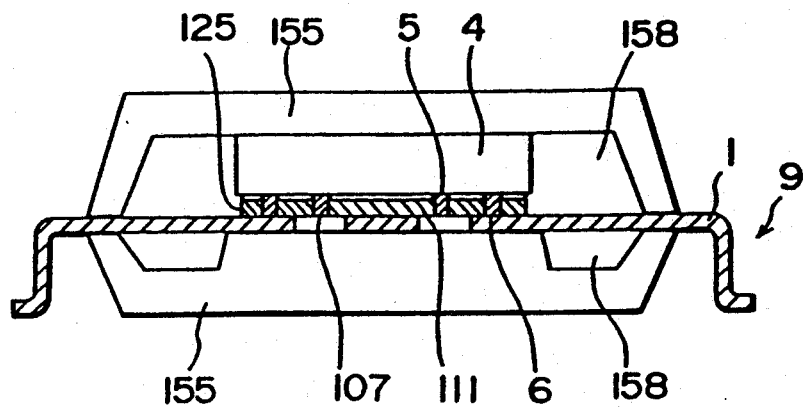
Figures 6, 13B:
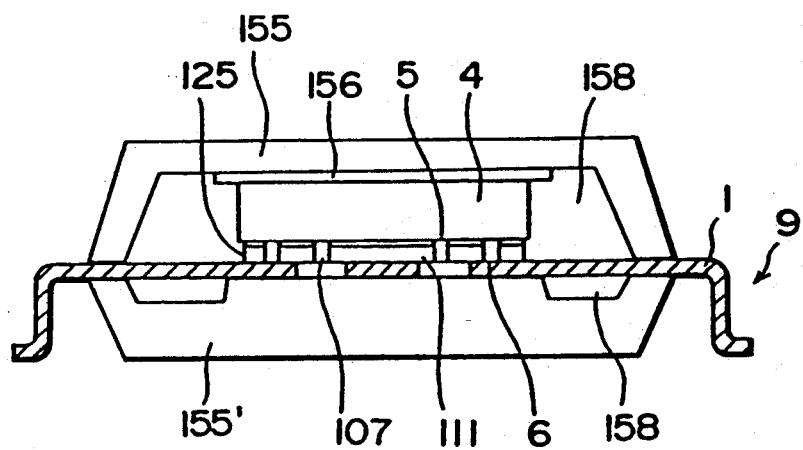

FIGS. 13(a) and 13(b)-1 show Example 6-D1.

The present embodiment is an example in which a semiconductor device 4 is used as a first electric circuit component and a lead frame 1 is used as a second electric circuit component.

In the present embodiment, ends of the metal members 107 have an S-like form.

Connecting regions 6 of the lead frame 1 made of 42-alloy on the surface of which Ag is plated were used. Connection is performed by a thermocompression method in which both ultrasonic heating and external heating are utilized.

Other conditions are identical to those in Example 5.

In the present embodiment as well, connecting regions are connected with a high reliability.

Furthermore, reliability in various characteristics is also excellent.

EXAMPLE 6-D2

FIG. 13(b)-2 shows Example 6-D2.

In the present embodiment, a plate made of stainless steel and having a thickness of 0.1 mm and holes 152 is connected by adhesive to a surface of the sealant 170 at one side in the case of Example 6-D1.

Other conditions are identical to those in Example 6-D1.

EXAMPLE 6-D3

FIG. 13(b)-3 shows Example 6-D3.

In the present embodiment, a plate 151 made of stainless steel and having a thickness of 0.1 mm and holes 152 is connected by adhesive to the surface opposite to the electric connecting member 125 of the semiconductor device 4 in the case of Example 6-D1.

Other conditions are identical to those in Example 6-D1.

EXAMPLE 6-D4

FIG. 13(b)-4 shows Example 6-D4.

In the present embodiment, a plate 151 made of stainless steel and having a thickness of 0.1 mm which is bent at nearly a right angle is disposed near the semiconductor device 4 in the case of Example 6-D1.

Other conditions are identical to those in Example 6-D1.

EXAMPLE 6-E1

FIG. 13(b)-5 shows Example 6-E1.

In the present embodiment, the semiconductor device 4 and the lead frame 1 is subjected to cap sealing.

Other conditions are identical to those in Example 5-D1.

EXAMPLE 6-E2

FIG. 13(b)-6 shows Example 6-E2.

In the present embodiment, a member 156 for adjustment is disposed between the semiconductor device 4 and the cap 155 and cap sealing is then performed in the case of Example 6-E1.

Other conditions are identical to those in Example 6-E1.

EXAMPLE 7

Figure 14A:
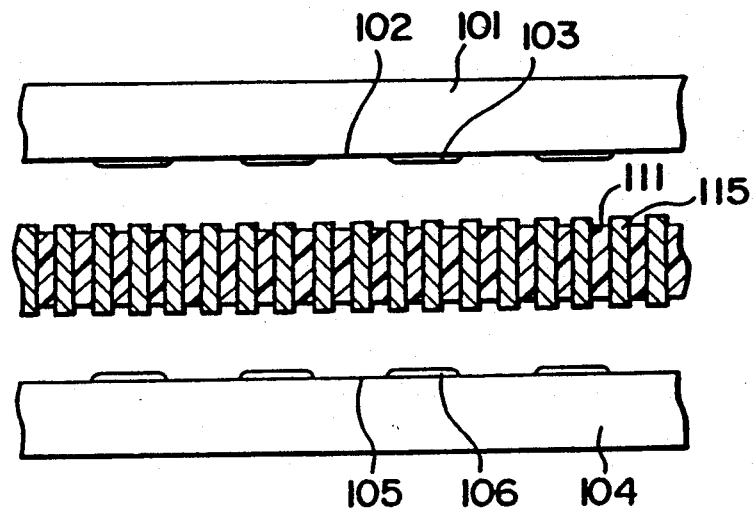
FIGS. 14(a) and 14(b) show states before connection and after connection, respectively.
Figure 14B:
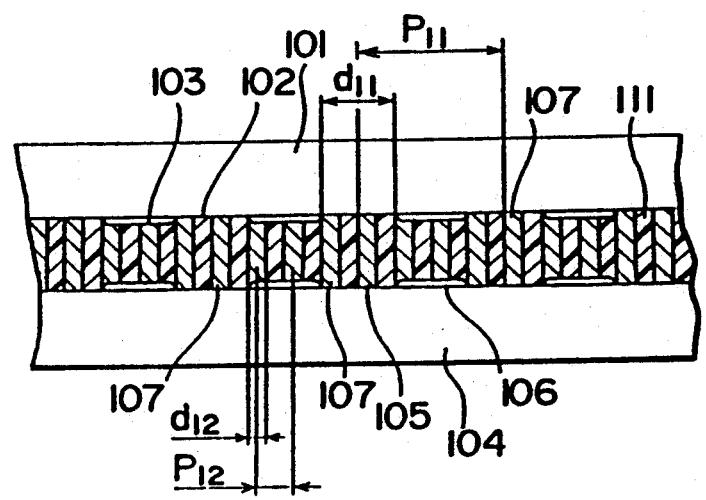

FIG. 14 shows Example 7.

In the present embodiment, the electric connecting member 125 is different from that shown in Example 5. That is, in the electric connecting member 125 of the present embodiment, a pitch between metal members is narrower than that shown in Example 5. That is, in the present embodiment, the pitch between metal members 107 is set at a spacing which is narrower than the spacing between connecting regions of a first circuit substrate.

In Example 5, since connecting positions of the electric connecting member 125 are arranged at connecting positions of the first circuit substrate 101 and the second circuit substrate 104, it is necessary to locate the electric connecting member 125. In the present embodiment, however, although it is necessary to position the first circuit substrate 101 and the second circuit substrate 104 to each other, it is not necessary to position the electric connecting member 125. Consequently, by selecting connecting dimensions ($d_{11}$, $P_{11}$) of the first circuit substrate 101 and the second circuit substrate 104 and connecting dimensions ($d_{12}$, $P_{12}$) of the electric connecting member at proper values, it is also possible to perform connection without positioning.

Other conditions are identical to those in Example 1-D1.

In the present embodiment as well, connecting regions are connected with a high reliability.

Furthermore, reliability in various characteristics is excellent.

EXAMPLE 8

Figure 15A:
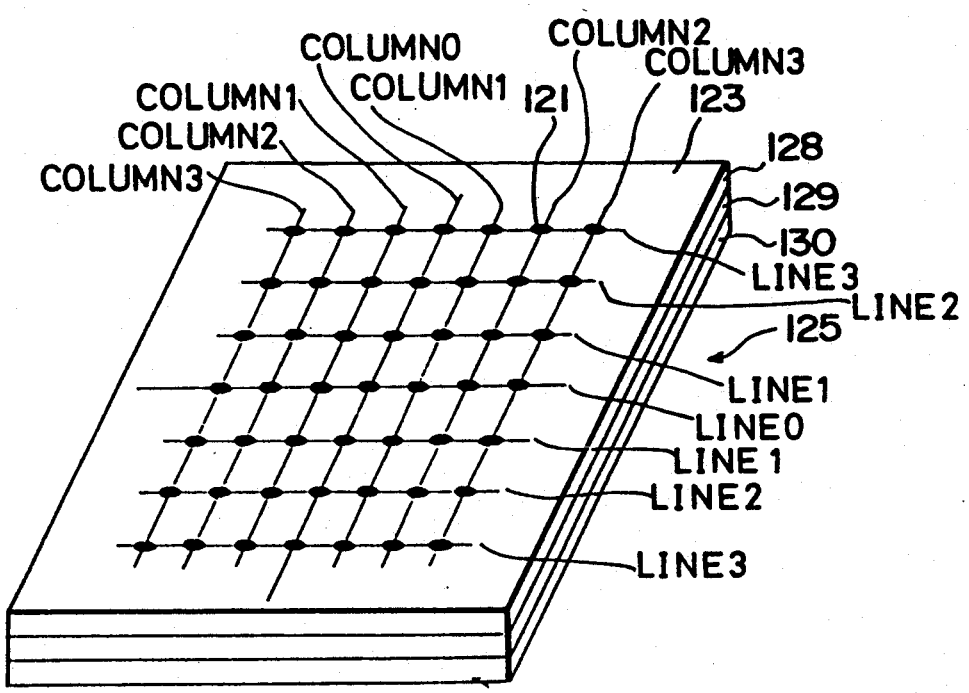
FIG. 15(a) is a perspective view and FIG. 15(b) is a cross-sectional view.
Figure 15B:
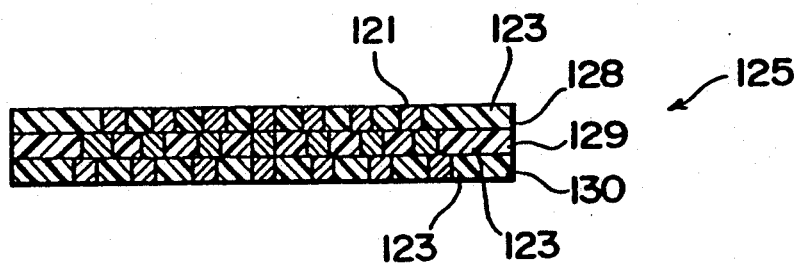

FIG. 15 shows an electric connecting member used in Example 8.

FIG. 5(a) is a perspective view of the electric connecting member, and FIG. 5(b) is a cross-sectional view of the electric connecting member.

An example of the production of such an electric connecting member will be hereinafter described.

First, three sheets of electric connecting members 128, 129 and 130 are prepared as in the production method of example 1-D1.

The position of the metal wire 121 of the first sheet 128 at line m and column n is shifted by ma and nb from the center. The position of the metal wire 121 of the second sheet 129 at line m and column n is shifted by mac and nbc from the center. The position of the metal wire 121 of the third sheet 130 at line m and column n is shifted by mad and mbd from the center. The values of a, b, c and d are selected so that the metal wires 121 are conducting in the vertical direction, but are not electrically conducting in the horizontal direction. The three electric connecting members are located atop one another, and laminated using an ultrasonic heating method to produce the electric connecting member 125.

Although, in the present embodiment, positions of the metals of the electric connecting members are selected at regular positions, such as line m and column n, they may also be located at random positions provided that metals are conducting in the vertical direction and not conducting in the horizontal direction.

Furthermore, although, in the present embodiment, a case in which three layers are laminated has been described, the number of sheets is arbitrary provided that it is not less than two. Although it has been described that lamination is performed using an ultrasonic heating method, other methods, such as pressing, sticking and the like, may also be used. Furthermore, protrusions may also be provided as shown in FIG. 11 by processing the electric connecting member of the present embodiment, or bumps 150 may also be provided as shown in FIG. 12.

Other conditions are identical to those in Example 1-D1.

In the present embodiment as well, connecting regions are connected with a high reliability.

Furthermore, reliability in various characteristics is excellent.

EXAMPLE 9

FIG. 16 shows an electric connecting member used in Example 9.

Figure 16A:
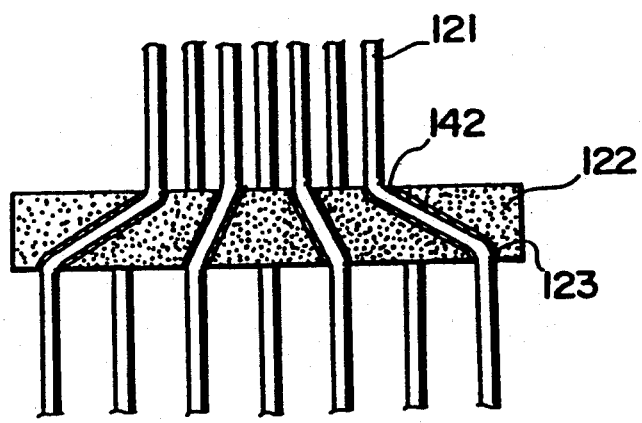
FIGS. 16(a) and 16(c) are cross-sectional views and FIG. 16(b) is a perspective view.
Figure 16B:
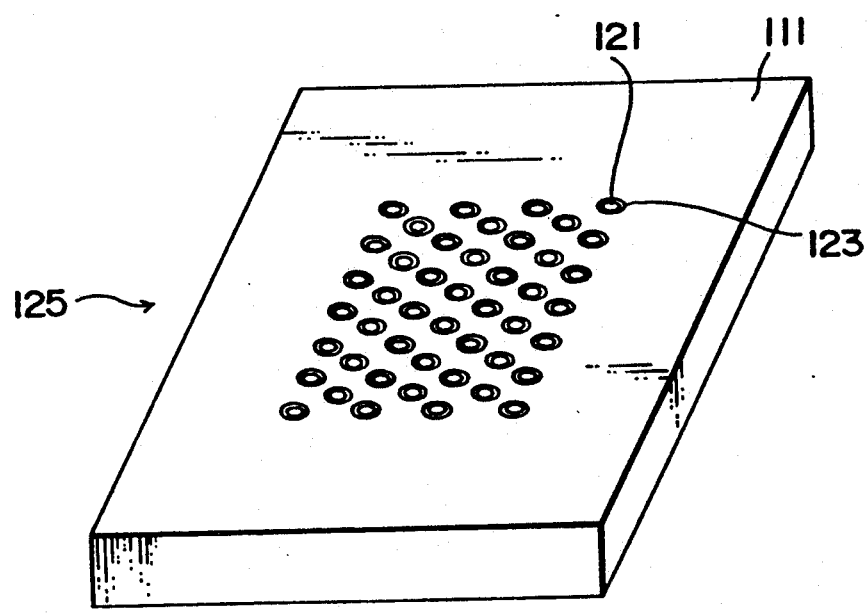
Figure 16C:
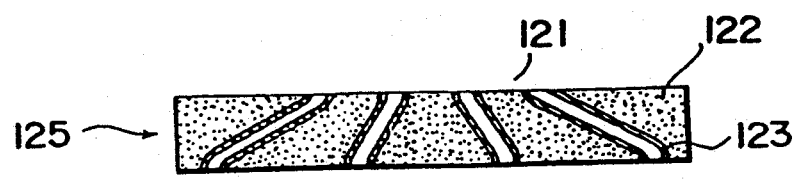

FIG. 16(a) is a cross-sectional view in the midst of production of the electric connecting member, FIG. 16(b) is a perspective view of the electric connecting member and FIG. 16(c) is a cross-sectional view of the electric connecting member.

Holes 142 having a diameter larger than 20 $\mu m \phi$ have previously been bored in a support member 111 consisting of alumina ceramics. Metal wires 121 having a diameter of 20 $\mu m \phi$ and consisting of a metal, such as Au, or an alloy are then 1 threaded through the holes 142, a resin 123 is poured between the support member 111 and metal wires 121, and the resin 123 is then hardened. The hardened resin 123 becomes an intervening material. The metal wires 121 are then sliced at positions 124 to prepare the electric connecting members 125. The electric connecting member 125 thus prepared is shown in FIG. 16(b) and 16(c).

Projections may also be provided as shown in FIG. 11 by processing the electric connecting member of the present embodiment, and bumps may also be provided as shown in FIG. 12.

Other conditions are identical to those in Example 1-D1.

In the present embodiment as well, connecting regions are connected with a high reliability.

Furthermore, reliability in various characteristics is excellent.

EXAMPLE 10

Example 10 of the present invention will be explained according to FIG. 17.

An electric circuit device of the present embodiment at least comprises an electric connecting member 125 comprising a support member 111 made of an organic material and metal members 107 which are plural electrically conductive members buried within the support member 111, one ends of the metal members 107 being exposed at one surface of the support member 111, and the other ends of the metal members 107 being exposed at another surface of the support member 111;

a circuit substrate 104 comprising connecting regions 105 and connected to one ends of the metal members 107 exposed at one surface of the support member 111 at the connecting regions 105 which exist at end portions of the circuit substrate;

a circuit substrate 184 comprising connecting regions 194 and connected to the other ends of the metal members 107 exposed at another surface of the support member 111 at the connecting regions 194 which exist at end portions of the circuit substrate.

The metal members 107 exposed at both surfaces of the support member 111 are arranged in a zigzag form, and the metal members 107 have a wave-like form.

It is to be noted that, in the present embodiment, plural semiconductor devices 101 are connected to the circuit substrate 104.

The electric circuit device of the present embodiment is a device for performing recording utilizing thermal energy, and the circuit substrate 184 comprises a heating body 400.

The present embodiment will be hereinafter explained in detail.

An example of the production of the electric connecting member 125 is explained in Example 1.

Figure 17A:
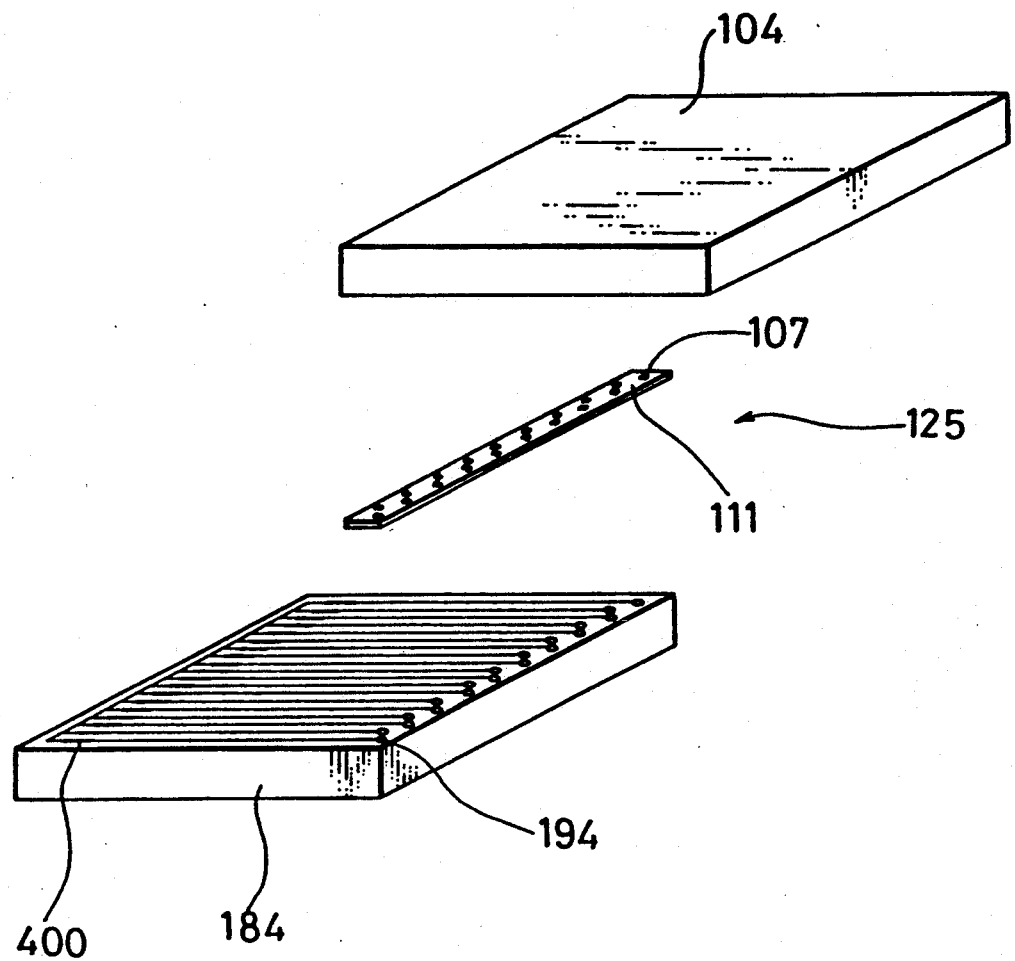
FIG. 17(a) is a perspective view and FIG. 17(b) is a front view.

As shown in FIGS. 5(a) and 17(a), the circuit substrate 104, the electric connecting member 125 and the circuit substrate 184 are prepared. The circuit substrate 104 and the circuit substrate 184 used in the present embodiment have many connecting regions 105 and 194 at end portions thereof.

At the connecting regions 105 of the circuit substrate 104, a metal is exposed at positions corresponding to the connecting regions 194 of the circuit substrate 184 and the connecting regions 108 and 109 of the electric connecting member 125.

Positioning is performed so that the connecting regions 105 of the circuit substrate 104 and the connecting regions 108 of the electric connecting member 125, or the connecting regions 194 of the circuit substrate 184 and the connecting regions 109 of the electric connecting member 125 correspond to one another. After positioning, Au on the connecting regions 105 of the circuit substrate 104 and Au on the connecting regions 108 of the electric connecting member 125, and Au on the connecting regions 194 of the circuit substrate 184 and Au on the connecting regions 109 of the electric connecting member 125 are connected together (FIGS. 5(b) and 17(b)).

In the present embodiment, connection by pressing is performed, but connection may also be performed by metallizing and/or alloying two surfaces or one surface of the electric connecting member. Connection may, of course, be performed with an adhesive.

In order to connect together the circuit substrate 104, the electric connecting member 125 and the circuit substrate 184 by metallization and/or alloy formation, there are the following three methods. Any of these methods may be used.

1) A method in which, after aligning the circuit substrate 104, the electric connecting member 125 and the circuit substrate 184 with one another, the connecting regions 105 of the circuit substrate 104 and the connecting regions 108 of the electric connecting member 125, and the connecting regions 194 of the circuit substrate 184 and the connecting regions 109 of the electric connecting regions 125 are connected together by metallization and/or alloy formation.

2) A method in which, after aligning the circuit substrate 104 and the electric connecting member 125 with each other, the connecting regions 105 of the circuit substrate 104 and the connecting regions 108 of the electric connecting member 125 are connected together by metallization and/or alloy formation, and the circuit substrate 184 is then positioned, and the connecting regions 109 of the electric connecting member 125 and the connecting regions 194 of the circuit substrate 184 are connected together by metallization and/or alloy formation.

3) A method in which, after aligning the circuit substrate 184 and the electric connecting member 125 with each other, the connecting regions 194 of the circuit substrate 184 and the connecting regions 109 of the electric connecting member 125 are connected together by metallization and/or alloy formation, and the circuit substrate 104 is then positioned, and the connecting regions 108 of the electric connecting member 125 and the connecting regions 105 of the circuit substrate 104 are connected together by metallization and/or alloy formation.

In this case, if it is arranged so that the melting point of an alloy layer at the connecting regions 108 is different from that of an alloy layer at the connecting regions 109, it is possible to remove connecting regions having a lower melting point if necessary. For example, a solder having a eutectic composition in which Sn:Pb weight ratio is 61.9%:38.1% may be used for the connecting regions 108, and a solder having a eutectic composition in which Sn:Pb weight ratio is 5%:95% may be used for connecting regions 109.

For electric circuit devices produced as described above, connectability of their connecting regions was investigated, and it was confirmed that they were connected with a high reliability.

Furthermore, reliability in various characteristics was also excellent.

EXAMPLE 11

FIG. 18 shows Example 11.

The present embodiment is an example in which the electric circuit device is an ink-jet recording head utilizing thermal energy. The circuit substrate 184 includes an ink room 401. A pitch of the connecting regions 105 and 194 of the circuit substrates 104 and 184 is 63.5 $\mu$m.

The configuration of the electric connecting member 125 is different from that in FIG. 10 as will be described below.

That is, in the electric connecting member 125 of the present embodiment, a pitch between metal members is narrower than that shown in Example 10. That is, in the present embodiment, a pitch between the metal members 107 is set at a spacing which is narrower than the spacing in the connecting member 105 and 194 of the circuit substrates 104 and 184.

In Example 10, since connecting positions of the electric connecting member 125 are arranged at connecting positions of the circuit substrate 104 and the circuit substrate 184, it is necessary to position the electric connecting member 125. In the present embodiment, however, although it is necessary to align the circuit substrate 104 and the circuit substrate 184 with each other, it is not necessary to position the electric connecting member 125. Consequently, by selecting connecting dimensions ($d_{11}$, $P_{11}$) of the circuit substrate 104 and the circuit substrate 184 and connecting dimensions ($d_{12}$, $P_{12}$) of the electric connecting member at proper values, it is also possible to perform connection without positioning.

For electric circuit devices produced as described above, connectability of their connecting regions was investigated, and they were connected with a high reliability.

Furthermore, reliability in various characteristics was also excellent.

EXAMPLE 12

Figure 19:
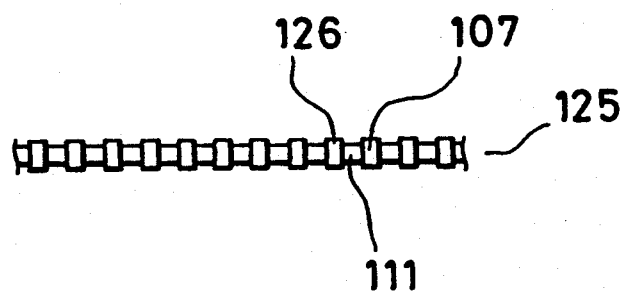
FIGS. 19 and 20 are cross-sectional views of electric connecting members used in Example 12.
Figure 20:
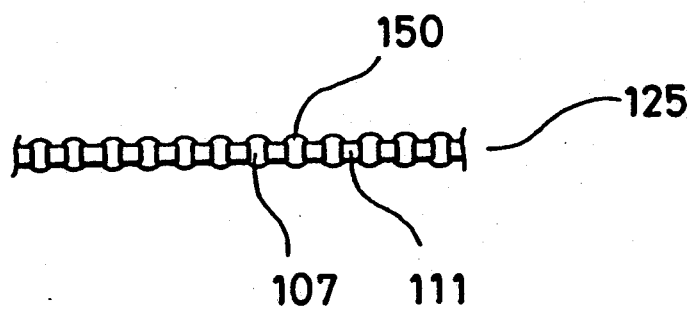

In the present embodiment, electric connecting members shown in FIGS. 19 and 20 were used.

That is, in the electric connecting member 125 shown in FIG. 19, a part of its metal members 107 (metal wires 121) is arranged in a zigzag form, and exposed portions of the metal members 107 protrude from the surfaces of the support member 111 (resin insulator). Such an electric connecting member 125 may, for example, be produced by the following method.

First, by the method described in Example 10, the electric connecting member shown in FIGS. 6(b) and 6(c) is prepared. Both surfaces of the electric connecting member may then be etched until the metal wires 121 protrude about 10 $\mu$m from the polyimide resin 123.

Although the amount of protrusion is 10 $\mu$m in the present embodiment, any amount may be selected.

The method for protruding the metal wires 121 is not limited to etching, but other chemical or mechanical methods may also be used.

Other conditions are identical to those in Example 10.

Relative to protrusions, bumps 150 as shown in FIG. 5 may also be formed by pinching the electric connecting member 125 in a mold having recesses at positions of the metal wires 121, and crushing protrusions 126 of the metal wires 121. In this case, the metal wires 121 hardly leave the insulator 111.

It is to be noted that the metal wires 121 constitute the metal members 107, and the resin 123 constitutes the insulator 111.

The bumps may also be produced by fusing the protrusions by heat, or by any other methods.

Connection in the present embodiment is performed in the following way. That is, an adhesive is coated on at least a part of either one of the circuit substrates 104 and 184, and the electric connecting member and the circuit substrate are stuck together. Excessive adhesive existing at the connecting regions and the support member 111 then forced out by applying a force, the metal members 107 of the electric connecting member 125 and the connecting regions 105 and 194 of the circuit substrates 104 and 184 are connected together, and the adhesive hardens.

EXAMPLE 13

Figure 21A:
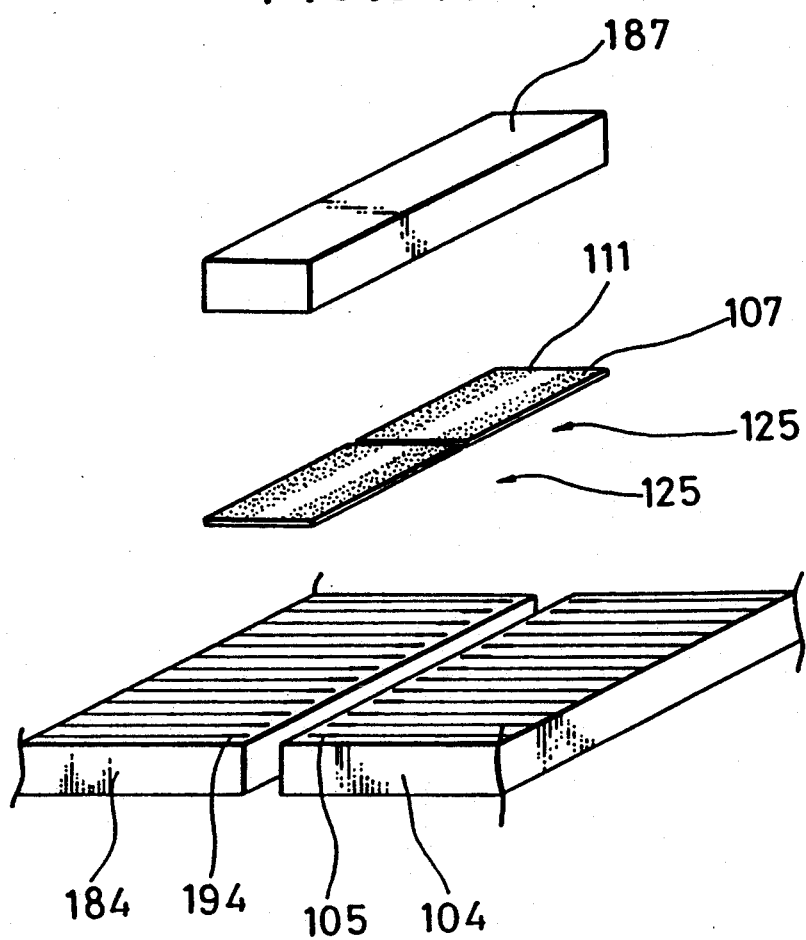
FIG. 21(a) is a perspective view and FIG. 21(b) is a front view.
Figure 21B:
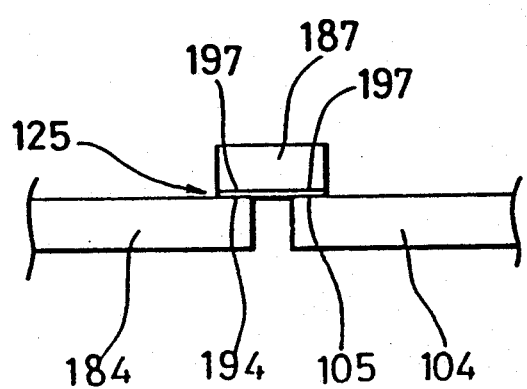

FIG. 21 shows Example 13.

In the present embodiment, the circuit substrates 104 and 184 are connected using two sheets of electric connecting members 125.

In the present embodiment, the circuit substrates 104 and 184 having many interconnection patterns (connecting regions) 105 and 194 at end portions thereof are used. In the present embodiment, the electric connecting members 125 are bridged between the circuit substrates 104 and 184 to connect the circuit substrates 104 and 184 at the lower surface in the drawing. Another circuit substrate 187 is also s connected to the electric connecting member 125 at the upper surface in the drawing to perform electric connection to the circuit substrate 104 and the circuit substrate 184.

Other conditions are identical to those in Example 11.

EXAMPLE 14

Figure 22A:
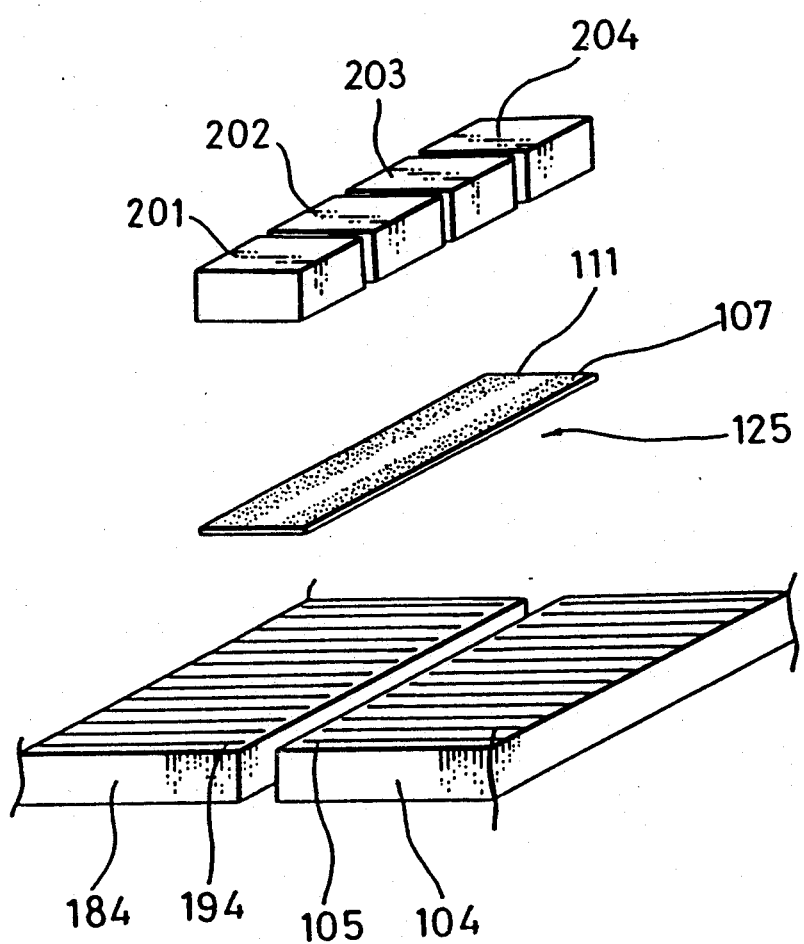
FIG. 22(a) is a perspective view and FIG. 22(b) is a front view.
Figure 22B:
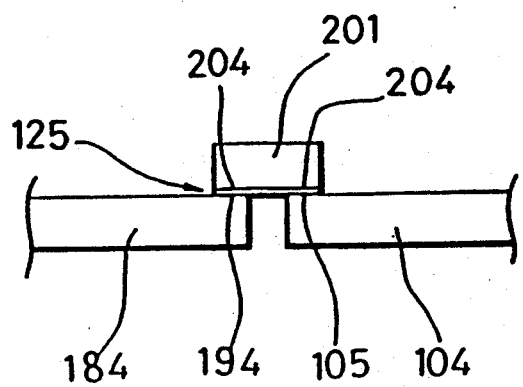

FIG. 22 shows Example 14.

In the present embodiment, on sheet of electric connecting member 125 is used, and plural semiconductor devices 201, 202, 203 and 204 are used instead of the circuit substrate 187 in the case of Example 13. That is, in the present embodiment, it is intended that the semiconductor devices 201, 202, 203 and 204 have the function of electric connection as well as the function as semiconductor devices.

In the present embodiment, it is possible to reduce the number of interconnection patterns in the circuit substrate 104 by taking in input electric signals from the circuit substrate 104. Accordingly, the present embodiment also has the advantages that an inexpensive circuit substrate can be provided, and connection can be performed without performing exact positioning.

EXAMPLE 15

FIG. 23 shows Example 15.

In the present embodiment, semiconductor devices 201, 202 and 203 are connected to the circuit substrate 104 via the electric connecting member 125, and semiconductor devices 204 and 205 are connected to the circuit substrate 184 via the electric connecting members 125 and 128.

The circuit substrate 104 and the semiconductor devices 201, 202 and 203, and the circuit substrate 184 and the semiconductor device 204 are connected together by metallization and/or alloy formation using a solder. It is arranged so that the melting points of metallized layers or alloyed layers at two surfaces of the electric connecting member are different from each other.

For producing such an electric connecting member, a solder is applied on both surfaces of the electric connecting member 125 shown in FIGS. 6(b) and 6(c) by plating. A eutectic solder (Sn:Pb=61.9 wt %:38.1 wt %) is plated on one surface of the electric connecting member, and a solder having a composition of Sn:Pb=5 wt %:95 wt % is plated on another surface. In the present embodiment, the latter solder was applied on the side of the circuit substrate 104. In order to remove a semiconductor device, the assembly may be heated at a temperature between the melting points of the two solders.

It is to be noted that the semiconductor device 205 is connected by pressing, and is removable without heating.

The semiconductor device 204 mounted to the circuit substrate 184 is sealed by a sealant 170.

For electric circuit devices produced as described above, connectability of their connecting regions was investigated, and they were connected with high reliability.

Furthermore, reliability in various characteristics was also excellent.

EXAMPLE 16

An electric connecting member used in Example 16 will be explained according to FIG. 15. FIG. 15 (a) is a perspective view of the electric connecting member, and FIG. 15 (b) is a cross-sectional view of the electric connecting member.

An example of the production of such an electric connecting member will be hereinafter described.

First, an electric connecting member comprising a resin 123 which contains a powder consisting of $SiO_2$ is prepared by the production method shown in Example 10. Three sheets of such electric connecting members 128, 129 and 130 are then prepared.

The position of the metal wire 121 of the first sheet 128 at line m and column n is shifted by ma and nb from the center. The position of the metal wire 121 of the second sheet 129 at line m and column n is shifted by mac and nbc from the center. The position of the metal wire 121 of the third sheet 130 at line m and column n is shifted by mad and mbd from the center. The values of a, b, c and d are selected so that the metal wires 121 are conducting in the vertical direction, but are not electrically conducting in the directions to the right and left of one another. The three electric connecting members are aligned with one another, and laminated using a thermocompression heating plus ultrasonic method to produce the electric connecting member 125.

Although, in the present embodiment, positions of the metals of the electric connecting members are selected at regular positions, such as line m and column n, they may also be located at random positions provided that metals are conducting in the vertical direction and not conducting in the directions to the right and left of one another.

Furthermore, although, in the present embodiment, a case in which three layers are laminated has been described, the number of sheets is arbitrarily provided and is no less than two. Although it has been described that lamination is performed using a thermocompression heating plus ultrasonic method, other methods, such as pressing, adhesive and the like, may also be used. Furthermore, protrusions may also be provided as shown in FIG. 11 by processing the electric connecting member of the present embodiment, or bumps 150 may also be provided as shown in FIG. 12.

Other conditions are identical to those in Example 10.

In the present embodiment as well, connecting regions were connected with high reliability.

Furthermore, reliability in various characteristics was excellent.

EXAMPLE 17

In the present embodiment, electric connection between each member is performed in the same manner as in Example 10 except that the electric connecting members used in Example 9 are used.

In the present embodiment as well, connecting regions were connected with high reliability.

Furthermore, reliability in various characteristics was also excellent.

Since the present invention is constituted as described above, the following various effects can be provided.

Relative to connection between semiconductor devices and electric circuit components, such as circuit substrates, lead frames and the like, a connection having high reliability can be obtained. Hence, the method of the present invention can replace the wire bonding method, TAB method and CCB method which have heretofore been used.

According to the present invention, since it is possible to dispose connecting regions of an electric circuit component at any positions (especially at inner portions or end portions) in high density, a connection having more points than those in the TAB method becomes possible. Hence, the present invention is a method which is suitable for a connection having multiple pin numbers. Furthermore, since an insulating material previously exists between adjacent metals of an electric connecting member, electric conduction between adjacent metals does not occur even if a pitch between adjacent metals is narrowed. Hence, a connection having points more than those in the CCB method becomes possible.

Since the amount of metal members used for an electric connecting member is smaller than that in conventional cases, the electric connecting member becomes less expensive even if an expensive metal, such as gold, is used.

It is possible to provide an electric circuit device, such as a high-density semiconductor device and the like.

In the present invention, since electrically conductive members exposed from a support member of an electric connecting member are arranged in a zigzag form, and an area occupied by connecting regions is larger than that of an interconnection pattern in an electric circuit component, a connection with higher density can be achieved.

Furthermore, since an electric connecting member can have a pitch which is apparently larger than a substantial pitch, its production becomes easier, and this fact is useful in reducing cost. Moreover, breakdown voltage between adjacent conductive members increases and electric properties, such as leakage current and the like, are improved. Hence, it is possible to provide an electric circuit device which has an excellent reliability.

In the present invention, since electrically conductive members exposed from a support member of an electric connecting member have a wave-like or S-like form, connection can be firmly maintained even if, for example, any force is applied to the connecting regions from any direction. This is because the unique shapes of the electric connection members provide additional surface area with which to bond to the electric circuit components. Likewise, by disposing the electric circuit members in zigzagged rows, more electrically conductive members can be disposed in the insulating material. This also enables a stronger bond between the electric connecting member and the electric circuit components. Accordingly, it is possible to provide an electric circuit device which has excellent mechanical and structural properties and reliability. Such properties can be more remarkably provided when connection is performed by a method other than metalization and/or alloy formation.

When electric circuit components are connected together by metallization and/or alloy formation via an electric connecting member, the electric circuit components are firmly and securely connected together. Hence, it is possible to provide an electric circuit device which has a low connection resistance and small variations, and which is also mechanically strong and has an extremely low failure rate.

Furthermore, when electric circuit components are connected together by metallization and/or alloy formation via an electric connecting member, it is not necessary to hold electric circuit components using jigs and the like during the production process and after production of an electric circuit device, and production of an electric circuit device and its administration after production are easy.

When all electric circuit components are connected by metallization and/or alloy formation via an electric connecting member, it is possible to provide an electric circuit device in which electric circuit components are firmly and securely connected together and which has an extremely low failure rate.

When all electric circuit components are connected by metallization and/or alloy formation via an electric connecting member, contact resistance between electric circuit components is smaller compared with when only one electric circuit component is connected.

Since all electric circuit components are connected together by a method other than metallization and/or alloy formation, it is possible to prevent deterioration of electric circuit components due to heat which is sometimes produced during metallization and/or alloy formation.

When electric circuit components are removably connected together, it becomes possible to replace failed components by other electric circuit components, even if various kinds of failures occur, and reduce costs, such as production cost and the like.

If the melting point of the metal layer or alloy layer formed by metallization and/or alloy formation in the electric circuit components to be removed is made to be lower than the melting point in other electric circuit components, electric circuit components are firmly and securely connected together while using an electric circuit device. Hence, it is possible to provide an electric circuit device which has a low connection resistance and variances and is also mechanically strong. It is also possible to replace only electric circuit components in which a failure and the like occur when a failure and the like occur by raising the temperature of at least the connecting layer of the electric circuit components in which a failure and the like occur at a temperature no lower than the melting point of this connecting layer and lower than the melting point of the connecting layer of the electric circuit components not to be replaced to melt the connecting layer of the failed electric circuit component. It is thus possible to reduce costs, such as a production cost and the like.

When performing resin sealing, it is possible to inject a sealant at high pressure. Hence, it is possible to perform sealing not only by a thermosetting resin for constant-pressure transfer, but also by a thermoplastic resin for which a high-pressure injection is needed.

When one or both of a powder and fibers of one kind or plural kinds of metals, alloys and ceramics are dispersed in a sealant, since the coefficient of thermal expansion of the sealant is close to the coefficient of thermal expansion of the electric circuit component, it is possible to provide an electric circuit device and, as a result, a semiconductor device in which there is less generation of thermal stress even if heat is applied, and which has high reliability.

Furthermore, if one kind or plural kinds of metals, alloys and ceramics as materials having excellent heat conductive properties are selected and dispersed in the sealant, the heat generated from the electric circuit components is rapidly radiated, and it is possible to provide an electric circuit device and, as a result, a semiconductor device having an excellent heat-radiating property.

In the present invention, when cap sealing is performed, since an electric circuit device is hollow, less thermal stress is generated, and it is possible to provide an electric circuit device which has high reliability. Furthermore, when a cap is contacted to an electric circuit component, and a material having a high heat-conductive property is used for the cap, the heat generated from the electric circuit component is rapidly conducted to the outside via the cap, it is possible to provide an electric circuit device having an excellent heat-radiating property. In addition, when the cap is made of a material having an excellent noise-shielding property, particularly a metal such as an iron-system metal and the like, it is possible to provide an electric circuit device having an excellent shielding effect.

When a member for adjustment is provided between the cap and the electric circuit component, it becomes possible to effectively perform assembly even when variations in the height of electric circuit components occur.

When a plate is connected to at least a part of the surface of a sealant, when a plate is connected to an electric circuit component and at least a part of at least one of them is buried by a sealant, and when at least a part of a plate disposed near an electric circuit component is buried, it is possible to release stress concentration even if an internal stress is produced within the device or a force is applied from the outside, and prevent cracks and the like which may sometimes be produced due to stress concentration. The plate also has an effect for lengthening a path from the outside up to electric circuit components, and hence water and the like from the outside hardly penetrate into electric circuit components. Hence, it is possible to improve reliability of the device.

When the material of the plate is a metal, such as stainless and the like, or ceramics, carbon, diamond and the like which are excellent in heat conductive property, the heat generated from electric circuit components can be promptly radiated to the outside. Hence, it is possible to provide an electric circuit device which is excellent in heat-radiating property. Furthermore, when the material of the plate is a metal, it is possible to interrupt a noise from the outside, and it is possible to provide an electric circuit device having excellent properties which is less influenced by a noise, also can interrupt electromagnetic noises generated in electric circuit components and generates less noise.

When one kind or plural kinds of metal material powder or fibers are included in an insulating material of a support member of an electric connecting member, it is possible to provide an electric circuit component having a high shielding effect.

When support member of an electric connecting member is configured by dispersing one or both of a powder or fibers consisting of one kind or plural kinds of metal materials and inorganic materials having excellent heat conductive properties, or when a support member is configured by insulating a metal material in an insulator so that an electric conductive member is insulated, the heat generated from an electric circuit component is radiated to the outside via the electric connecting member and, in addition, other electric circuit components. Hence, it is possible to provide an electric circuit device having an excellent heat-radiating property.

If one or both of a powder and fibers of one kind or plural kinds of metal materials and inorganic materials, which have the coefficient of thermal expansion relatively close to the coefficient of thermal expansion of the electric circuit component, are dispersed in an insulator of an electric connecting member, the coefficient of thermal expansion of the resultant material becomes close to the coefficient of thermal expansion of the electric circuit component. Hence, it is possible to provide an electric circuit device and, as a result, a semiconductor device in which thermal stress is less generated even if heat is applied, and which has a high reliability.

What is claimed is:

1. An electric circuit device comprising:
    an electric connecting member having a support member made of an electrically insulating material and a plurality of electrically conductive members, having first and second ends, buried in said support member and being isolated from one another, with said first ends of said electrically conductive members being exposed at a first surface of said support member, and said second ends of said electrically conductive members being exposed at a second surface of said support member;
    a first electric circuit component having connecting regions connected to said first ends of said electrically conductive members; and
    a second electric circuit component having connecting regions connecting to said second ends of said electrically conductive members, wherein
    the first and second exposed ends of at least one electrically conductive member is wave-like or S-like in shape along a surface substantially parallel to said first surface of said support member, and said ends of said electrically conductive members are diffused so as to exchange atoms with said connecting regions of said electric circuit components.

2. An electric circuit device according to claim 1, wherein said electrically conductive members are made of gold.

3. An electric circuit device according to claim 1, wherein said electrically conductive members are made of an alloy.

4. An electric circuit device according to claim 1, wherein all of said electric circuit components are connected by metallization.

5. An electric circuit device according to claim 1, wherein some of said electric circuit components are connected by metallization.

6. An electric circuit device according to claim 1, further comprising a cap sealer for sealing said first and second electric circuit components.

7. An electric circuit device according to claim 1, where at least a part of said exposed electrically conductive members are arranged in adjacent rows that are in a zigzag form. a

* * * * *

UNITED STATES PATENT AND TRADEMARK OFFICE
CERTIFICATE OF CORRECTION

PATENT NO. : 5,197,892

DATED : March 30, 1993

INVENTOR(S) : Tetsuo Yoshizawa, et al.

It is certified that error appears in the above-identified patent and that said Letters Patent is hereby corrected as shown below:

ON THE COVER PAGE

Item [75]    "Yoshimi Tarayama" should read --Yoshimi Terayama--.

COLUMN 4

Figure 17B:
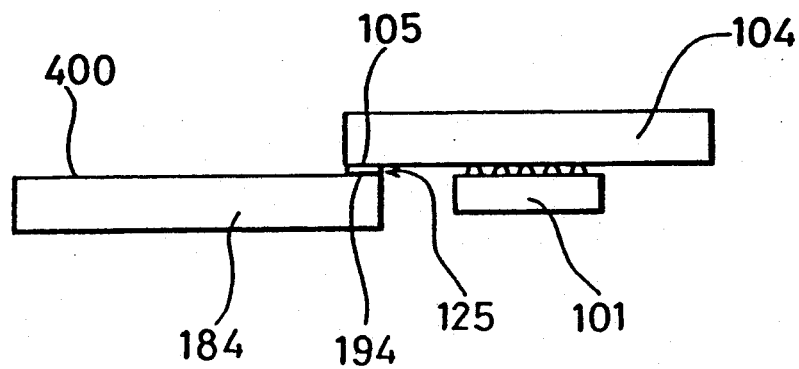
Figure 18A:
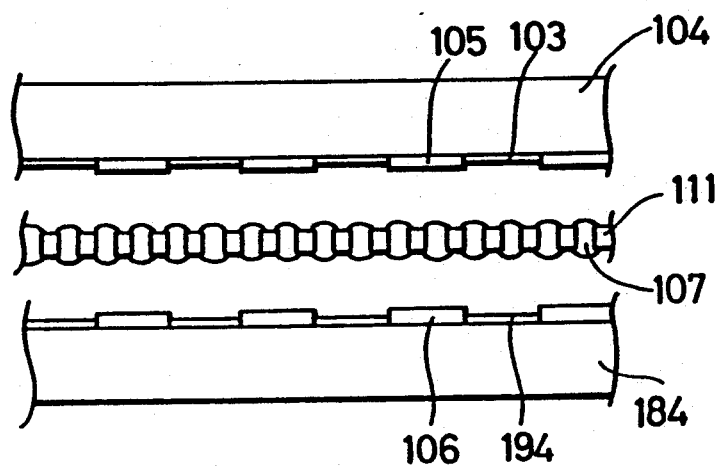
FIG. 18(a) is a cross-sectional view.
Figure 18B:
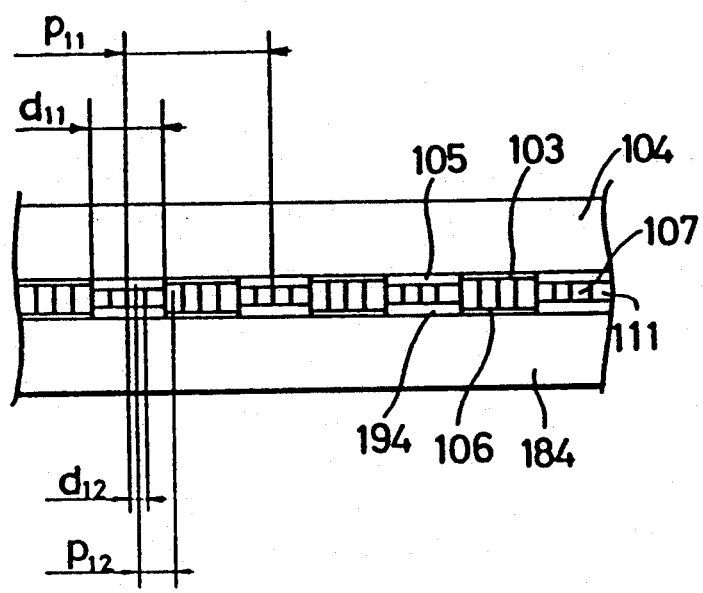
FIG. 18(b) is a cross-sectional view.
Figure 18C:
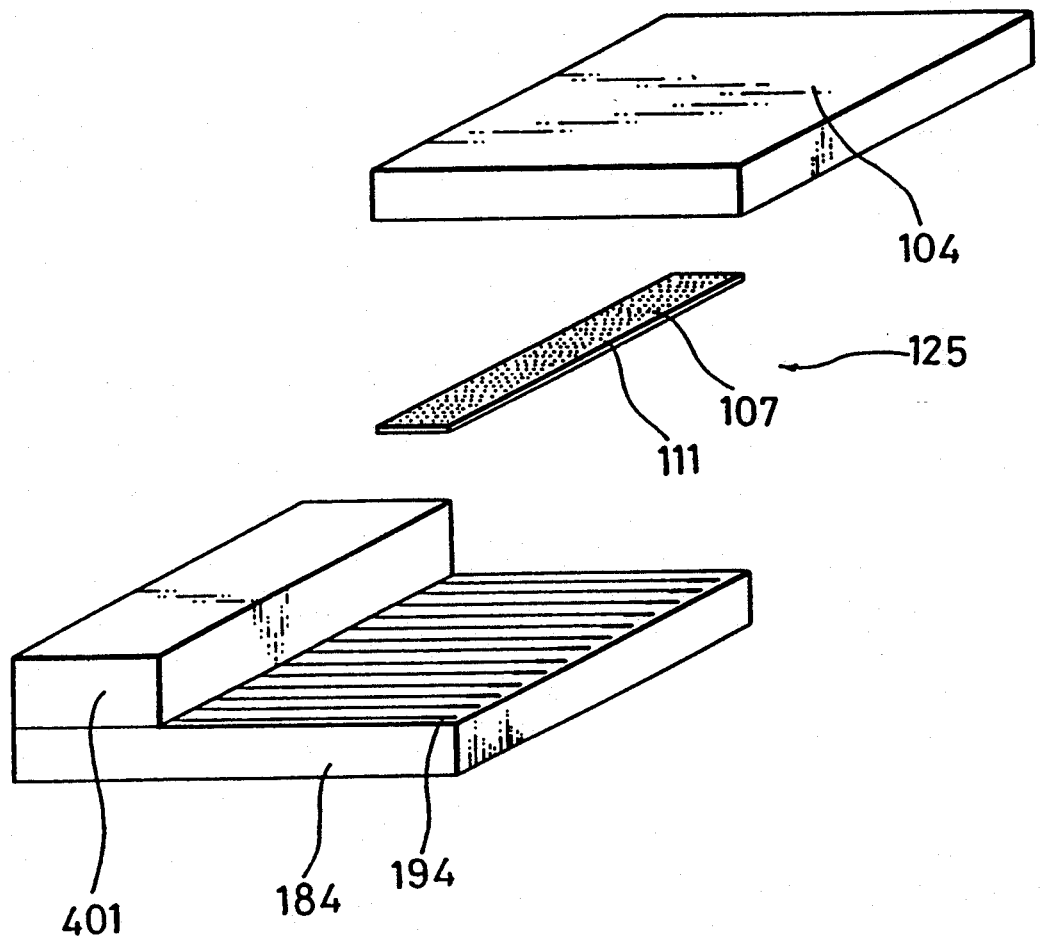
FIG. 18(c) is a perspective view and FIG. 18(d) is a front view.
Figure 18D:
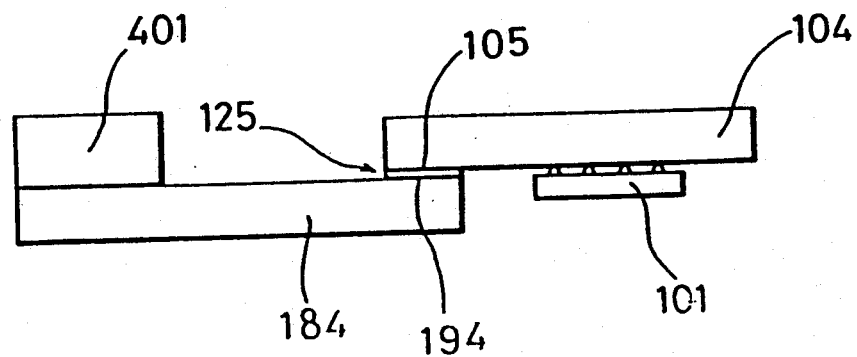

Line 59, "Fig. 17(a) is a perspective" should read --FIG. 17(a) is a cross-sectional view before connection, FIG. 17(b) is a cross-sectional view showing a state after connection and FIGS. 17(c) and 17(d) show a thermal print head; FIG. 17(c) is a perspective--; and "FIG. 17(b)" should read --FIG. 17(d)--.

COLUMN 7

Line 31, "metyl metacrylate" should read --methyl methacrylate--;
Line 33, "metacrylate" should read --methacrylate--; and "vilylidene" should read --vinylidene--.

COLUMN 9

Line 37, "that" should read --than--.

COLUMN 10

Line 12, "polyamideemide" should read --polyamideimide--.

UNITED STATES PATENT AND TRADEMARK OFFICE
CERTIFICATE OF CORRECTION

PATENT NO. : 5,197,892

DATED : March 30, 1993

INVENTOR(S) : Tetsuo Yoshizawa, et al.

Page 2 of 2

It is certified that error appears in the above-indentified patent and that said Letters Patent is hereby corrected as shown below:

<u>COLUMN 33</u>
    Line 11, "stainless" should read --stainless steel--.

Signed and Sealed this

Sixteenth Day of November, 1993

Attest:

BRUCE LEHMAN

*Attesting Officer*    *Commissioner of Patents and Trademarks*